(12) United States Patent
Ishii et al.

(10) Patent No.: US 6,713,968 B2
(45) Date of Patent: Mar. 30, 2004

(54) PLASMA PROCESSING APPARATUS

(75) Inventors: Nobuo Ishii, Amagasaki (JP); Yasuyoshi Yasaka, Uji (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/945,822

(22) Filed: Sep. 5, 2001

(65) Prior Publication Data

US 2002/0038692 A1 Apr. 4, 2002

(30) Foreign Application Priority Data

Sep. 6, 2000 (JP) ........................... 2000-270545
Jan. 18, 2001 (JP) ........................... 2001-010781

(51) Int. Cl.$^7$ ............................................... H01J 7/24
(52) U.S. Cl. ........................... 315/111.21; 118/723 AN
(58) Field of Search ....................... 315/111.21, 111.01, 315/111.41; 118/723 AN, 723 MW, 723 ME, 723 I; 156/345.41, 345.42, 345.48, 345.49

(56) References Cited

U.S. PATENT DOCUMENTS

| | | | | |
|---|---|---|---|---|
| 4,985,109 A | * | 1/1991 | Otsubo et al. | ......... 156/345.41 |
| 5,698,036 A | * | 12/1997 | Ishii et al. | ......... 118/723 MW |
| 6,020,858 A | * | 2/2000 | Sagisaka | ..................... 343/771 |
| 6,158,383 A | * | 12/2000 | Watanabe et al. | ..... 118/723 AN |
| 6,325,018 B1 | * | 12/2001 | Hongoh | ................ 118/723 AN |
| 6,343,565 B1 | * | 2/2002 | Hongoh | ............... 118/723 MW |
| 6,372,084 B2 | * | 4/2002 | Hongo et al. | ........ 118/723 ME |

FOREIGN PATENT DOCUMENTS

| | | |
|---|---|---|
| JP | 64-03621 | 2/1989 |
| JP | 3-191073 | 8/1991 |
| JP | 3-191973 | 8/1991 |
| JP | 6-188237 | 7/1994 |
| JP | 10-022098 | 1/1998 |
| JP | 10-303638 | 11/1998 |

* cited by examiner

Primary Examiner—James Clinger
Assistant Examiner—Ephrem Alemu
(74) Attorney, Agent, or Firm—Finnegan, Henderson, Farabow, Garrett & Dunner, LLP

(57) ABSTRACT

A plasma processing apparatus has a process container, a carriage housed in the process container and having a surface for carrying an object to be processed, and a slot antenna disposed to oppose the carrying surface of the carriage and having a radiation plane formed with a plurality of slots so as to radiate electromagnetic fields to the inside of the process container through the plurality of slots. The slot antenna radiates the electromagnetic fields in a direction oblique to the normal direction of the radiation plane.

19 Claims, 15 Drawing Sheets

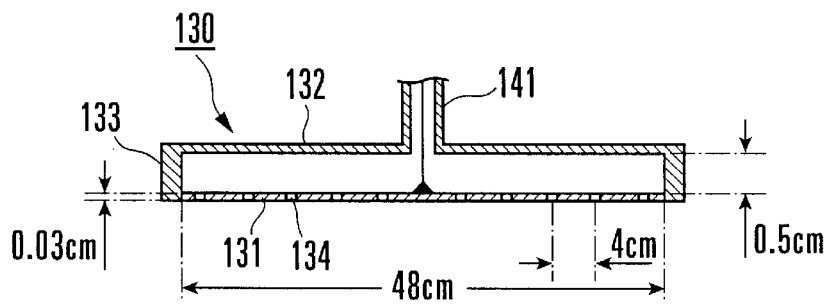
FIG.9A
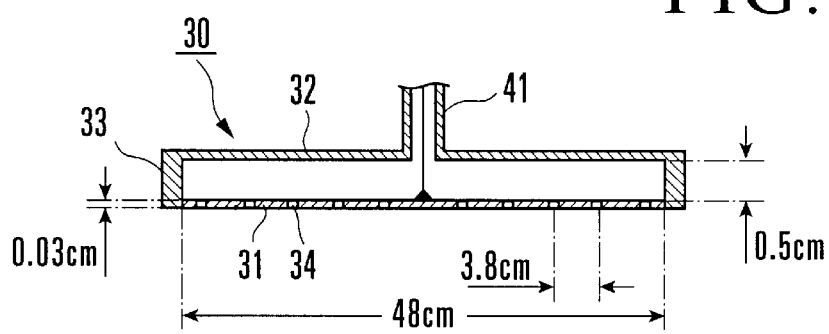
FIG.9B
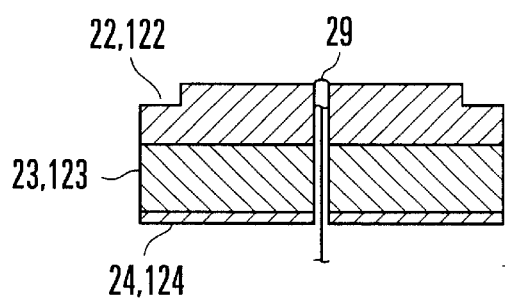
FIG.9C
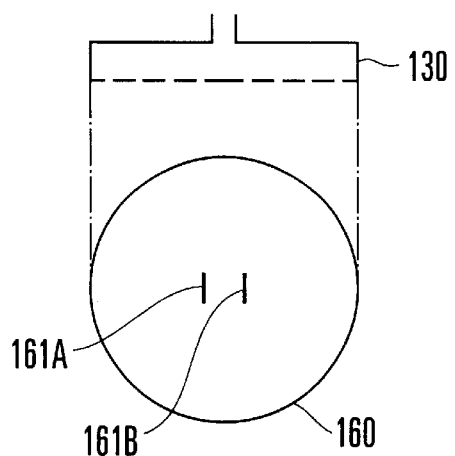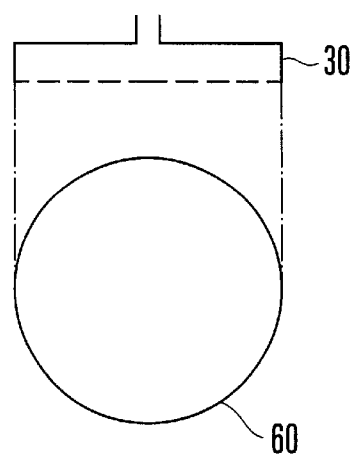
FIG.10A  FIG.10B

PLASMA PROCESSING APPARATUS

BACKGROUND OF THE INVENTION

The present invention relates to a plasma processing apparatus for generating plasma by high-frequency electromagnetic fields to perform a predetermined process.

In manufacture of semiconductor devices and flat panel displays, plasma processing apparatus have been used widely and frequently for performing processes such as formation of oxide films, crystal growth in semiconductor layer, etching and ashing. Of the plasma processing apparatus as above, a high-frequency plasma processing apparatus is available in which high-frequency electromagnetic fields from an antenna are admitted to a process container to generate high-density plasma. This type of high-frequency plasma processing apparatus can generate plasma stably even when the pressure of plasma gas is relatively low and can be applied to widespread uses to advantage.

An etching apparatus using a conventional high-frequency plasma processing apparatus is constructed as shown in FIG. 20. In FIG. 20, the construction is partly illustrated in sectional form.

A dielectric plate 113 is disposed horizontally in an upper opening of a cylindrical process container 111. They are jointed to each other through the medium of a sealing member 112 to keep airtightness of the interior of the process container 111. Evacuation ports 114 for vacuum evacuation are formed in the bottom of the process container 111 and a nozzle 116 for gas supply passes through the sidewall of the process container 111. Housed in the process container is a carriage 122 for carrying a substrate 121 that is an object to be etched. The carriage 122 is connected to a high-frequency power supply 126 for biasing.

A radial antenna 130 is disposed above the dielectric plate 113. Peripheries of the dielectric plate 113 and radial antenna 130 are covered with a shield member 117.

The radial antenna 130 includes two mutually parallel conductive plates 131 and 132 forming a radial waveguide 136 and a ring member 133 for connecting outer peripheries of these conductive plates 131 and 132. A great number of slots 134 are formed in the conductive plate 131 constituting a radiation plane. When the wavelength of an electromagnetic field propagating inside the radial waveguide 136 (hereinafter referred to as a guide wavelength) is $\lambda_g$, pitch P2 between adjacent slots in the radial direction is set to be equal to the guide wavelength $\lambda_g$. An inlet port 135 for admitting the electromagnetic field to the inside of the radial waveguide 136 is formed in the center of the conductive plate 132. The inlet port 135 is connected with a high-frequency generator 145 through a waveguide 141.

The etching apparatus constructed in this manner operates as will be described below.

After the interior of the process container 111 is first evacuated to a predetermined degree of vacuum, a mixture gas of, for example, $CF_4$ and Ar is supplied from the nozzle 116 under the control of flow rate. Under this condition, a high-frequency electromagnetic field is supplied from the high-frequency generator 145 to the radial antenna 130 by way of the waveguide 141.

While propagating inside the radial waveguide 136, the electromagnetic field supplied to the radial antenna 130 is radiated from the many slots 134 formed in the conductive plate 131. Since the pitch p2 between adjacent slots in the radial direction is set to $\lambda_g$, the electromagnetic fields are radiated in a direction substantially vertical to the conductive plate 131 (radiation plane). Then, the electromagnetic fields transmit through the dielectric plate 113 so as to be admitted to the inside of the process container 111.

Electric fields of the electromagnetic fields admitted to the process container 111 ionize the gas prevailing in the process container 111 to generate plasma in a space S1 above the substrate 121 representing the object to be processed. At that time, the electromagnetic fields admitted to the process container are not totally absorbed directly by the plasma generation but unabsorbed remaining electromagnetic fields repeat reflection inside the process container 111 to form standing waves in a space S2 between the radial antenna 130 and the plasma generation space S1. As is known in the art, electric fields of the standing waves also take part in the plasma generation.

The thus generated ions of plasma are extracted by negative potential at the carriage 122 and utilized for an etching process.

SUMMARY OF THE INVENTION

In the conventional etching apparatus shown in FIG. 20, the standing waves formed in the space S2 affect the plasma generation to a great extent. Since the distribution of the electric fields of the standing waves is difficult to control, plasma cannot be generated uniformly in the conventional etching apparatus. For example, through observation of plasma that is generated inside the process container 111 with the conventional etching apparatus, it is confirmed that portions 161A and 161B where plasma is generated at a high density take place near the center of a plasma generation region 160 as shown in FIG. 10A to be referred to later.

Consequently, the conventional apparatus faces a problem that the etching process proceeds more rapidly on the substrate 121 representing the processing object in underlying regions corresponding to the high-density plasma portions. The problem of causing spots in the processing amount is not specific to only the etching apparatus shown in FIG. 20 but is common to conventional plasma apparatus.

The present invention contemplates elimination of the above conventional problems and it is an object of the invention to improve the distribution of plasma generated by high-frequency electromagnetic fields.

To accomplish the above object, according to the invention, in a plasma processing apparatus using a slot antenna having a radiation plane formed with a plurality of slots so as to radiate electromagnetic fields to the inside of a process container through the plurality of slots, the slot antenna radiates the electromagnetic fields in a direction oblique to the normal direction of the radiation plane.

When a dielectric plate is disposed in parallel to the antenna radiation plane, the electromagnetic fields are radiated in a direction oblique to the normal direction of the dielectric plate. A plasma plane opposing the dielectric plate in the process container has a form extending along the dielectric plate and therefore, the electromagnetic fields directly incident upon plasma inside the process container from the slot antenna through the dielectric plate come into the plasma in a direction oblique to the normal direction of the plasma plane.

To explain briefly how an electric field of an electromagnetic field changes in a region ranging from the boundary between the plasma and dielectric plate to a point where the plasma density assumes a cut-off density, the intensity of a component of electric field in a direction parallel to the plasma plane is maintained to a substantially constant level but the intensity of a component of electric field in the normal direction of the plasma plane increases monotonously. Accordingly, by making the electromagnetic fields incident in a direction oblique to the normal direction of the plasma plane, a resultant component of the two components can take place having a higher electric field intensity than that obtained when the electromagnetic fields are made to be incident in the normal direction of the plasma plane. By virtue of this, the plasma generation efficiency attributable to the electric fields of the electromagnetic fields directly coming from the slot antenna can be improved.

Through this, contribution of the electric fields of the electromagnetic fields directly coming into the process container from the slot antenna to the plasma generation can be promoted and as a result, the participation of the electric fields of the standing waves (that is, indirectly incident waves) formed in the process container to the plasma generation can be reduced relatively. Since the former is controllable more easily than the latter, the distribution of plasma can be improved as compared to that in the conventional apparatus.

When in the aforementioned plasma processing apparatus the ratio $\epsilon_v/\epsilon_a$ between specific inductivity $\epsilon_v$ inside the slot antenna and specific inductivity $\epsilon_a$ outside the slot antenna is $\epsilon_r$, the wavelength of the electromagnetic field propagating in the slot antenna is $\lambda_g$, the pitch between adjacent slots in the propagation direction of the electromagnetic field inside the slot antenna is defined as $p=\alpha \cdot \lambda_g$ ($\alpha>0$) and N is an integer not less than 0, the $\epsilon_r$, N and $\alpha$ may preferably be so set as to satisfy $$-1 \leq \epsilon_r^{1/2}(N/\alpha - 1) \leq 1$$

$N \neq \alpha$ for N being not less than 1.

Under this condition, the electromagnetic fields are radiated in a direction oblique to the normal direction of the radiation plane of the slot antenna.

The pitch between adjacent slots can be changed in the propagation direction of the electromagnetic field inside the slot antenna. In this manner, the radiation direction of the electromagnetic fields can be distributed in the radial direction in order to adjust the distribution of plasma.

Further, the apparatus may further comprise a dielectric member disposed to isolate the slot antenna from the carrying surface of the carriage and having a surface oblique to the radiation plane of the slot antenna. The dielectric member may take the form of a dome. The dielectric member may be for isolating at least part of the inner surface of the process container from the carrying surface of the carriage.

Alternatively, the apparatus may further comprise a first dielectric member disposed to isolate the slot antenna from the carrying surface of the carriage and having a surface oblique to the radiation plane of the slot antenna, a second dielectric member disposed, when referenced to the first dielectric member, on the side opposite to the carriage and being cooperative with the first dielectric member to form a hermetically closed space, and circulation means for circulating fluid through the hermetically closed space to adjust the temperature of the first dielectric member. The second dielectric member may be disposed either between the first dielectric member and the slot antenna or on the way of a feed line for the slot antenna.

As the slot antenna, a radial antenna may be used including first and second conductive plates mutually spaced to oppose to each other and a ring member for shielding the first and second conductive plates at their outer peripheries, wherein the first conductive plate is formed with a plurality of slots and an inlet port for admitting the electromagnetic field to a space between the first and second conductive plates is formed in the center of the second conductive plate. Also, a rectangular waveguide antenna including a rectangular waveguide having one surface formed with a plurality of slots may be used as the slot antenna.

BRIEF DESCRIPTION OF THE DRAWINGS

FIGS. 9A to 9C are diagrams for explaining devices used for photographing plasmas.

FIGS. 10A to 10B are schematic diagrams of images obtained when photographing plasmas.

DESCRIPTION OF THE PREFERRED EMBODIMENTS

Embodiments of the invention will now be described with reference to the accompanying drawings.

First Embodiment

Figure 1:
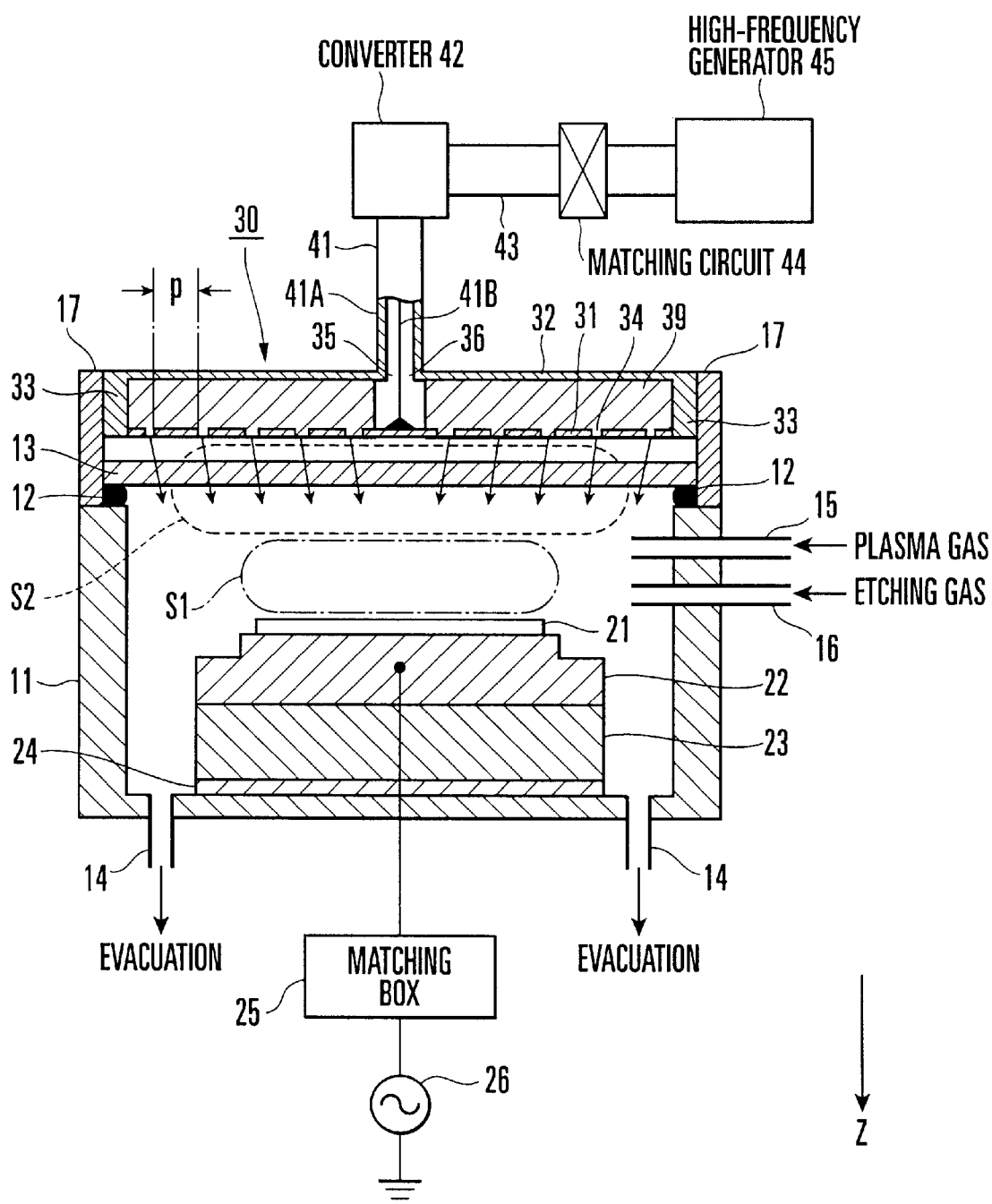
FIG. 1 is a diagram, partly sectioned, showing the construction of an etching apparatus according to a first embodiment of the invention.

Firstly, an example in which the present invention is applied to etching apparatus will be described. Referring to FIG. 1, an etching apparatus according to a first embodiment of the invention is constructed as shown therein. In FIG. 1, the construction is partly illustrated in sectional form. For the convenience of explanation, the vertical direction is defined as Z-axis direction.

The etching apparatus shown in FIG. 1 has a cylindrical process container 11 having an upper opening. The process container 11 is made of a conductive material such as aluminum. A planar dielectric plate 13 is horizontally mounted in the upper opening of the process container 11. Quartz glass or ceramics (such as $Al_2O_3$ or AlN) having a thickness of about 20 to 30 mm is used for the dielectric plate 13. The process container 11 is jointed to the dielectric plate 13 through the medium of a sealing member 12 such as an O-ring to keep the interior of process container 11 airtight.

Evacuation ports 14 in communication with a vacuum pump (not shown) are formed in the bottom of the process container 11 and the interior of the process container 11 can be maintained at a desired degree of vacuum.

A plasma gas supply nozzle 15 for admitting a plasma gas such as Ar to the inside of the process container 11 and a process gas supply nozzle 16 for admitting an etching gas such as $CF_4$ are formed in the sidewall of the process container 11 such that they are vertically spaced apart from each other. These nozzles 15 and 16 are formed of, for example, quartz pipes.

Housed in the process container 11 is a carriage 22 having a surface for carrying a substrate 21 representing an etched object (an object to be processed). The carriage 22 is on the one hand fixed to a support base 23 fixedly mounted to the bottom of the process container 11 through an insulating plate. The carriage 22 is on the other hand connected to a high-frequency power supply 26 for biasing via a matching box 25. The high-frequency power supply 26 generates a high frequency of, for example, 2 to 13.56 MHz.

A radial antenna 30, a kind of slot antenna, is disposed above the dielectric plate 13, having its radiation plane (conductive plate 31 to be described later) facing downwards. The radial antenna 30 radiates high-frequency electromagnetic fields to the interior of the process container 11 by way of the dielectric plate 13. The radial antenna 30 is isolated from the process container 11 by means of the dielectric plate 13 so as to be protected from plasma generated inside the process container 11.

Peripheries of the dielectric plate 13 and radial antenna 30 are covered with a cylindrical shield member 17. The shield member 17 is made of a metal, for example, aluminum. The electromagnetic fields radiated from the radial antenna 30 are shielded by means of the shield member 17 and therefore, they are prevented from leaking to the outside of the etching apparatus.

The radial antenna 30 is connected to a high-frequency generator 45 by way of coaxial cable line 41, rectangular/coaxial converter 42 and rectangular waveguide 43. The high-frequency generator 45 is adapted to generate a high frequency of, for example, 2.45 GHz. The output frequency of the high-frequency generator 45 may be in the range of from 1 GHz to ten and several GHz. By providing a matching circuit 44 for impedance matching on the way of the rectangular waveguide 43, the use efficiency of electric power can be improved.

The construction of the radial antenna 30 will be further described.

As shown in FIG. 1, the radial antenna 30 includes a first conductive plate 31 forming the radiation plane, a second conductive plate 32 arranged above the conductive plate 31 to oppose it and a ring member 33 for connecting outer peripheries of the conductive plates 31 and 32 to shield a space between the conductive plates 31 and 32.

Formed in the center of the conductive plate 32 constituting the antenna upper plane is an inlet port 35 for admitting the high-frequency electromagnetic field from the high-frequency generator 45 to the interior of a radial waveguide 36 defined by the two conductive plates 31 and 32. Formed in the conductive plate 31 constituting the antenna lower plane are a great number of slots 34. The conductive plate 31 is disposed in parallel with the dielectric plate 13.

When the electromagnetic field propagating in the radial waveguide 36 has a wavelength (hereinafter referred to as a guide wavelength) of $\lambda_g$, the distance between the two conductive plates 31 and 32 is set to less than $\lambda_g/2$. For example, in case the high frequency of 2.45 GHz frequency is used, the distance between the conductive plates 31 and 32 is set to less than 6 cm if the specific inductivity $\epsilon_v$ in the radial waveguide 36 is 1 (one). By making the distance less than $\lambda_g/2$, formation of a standing wave can be prevented between the conductive plates 31 and 32. But for prevention of discharge between the two conductive plates 31 and 32, the distance between the conductive plates 31 and 32 may preferably be not less than $0.5/(\epsilon_v)^{1/2}$ cm.

The conductive plates 31 and 32 and ring member 33 as above are each formed of a conductive material such as copper or aluminum. A dielectric member such as ceramics (specific inductivity $\epsilon_v>1$) 39 may be disposed as shown in FIG. 1 between the conductive plates 31 and 32, that is, in the radial waveguide 36.

As described above, the radial antenna 30 is connected with the coaxial line 41 which in turn is connected to the high-frequency generator 45. An outer conductor 41A of the coaxial line 41 is connected to the peripheral edge of the inlet port 35 formed in the conductive plate 32. An inner conductor 41B of the coaxial line 41 has its tip end formed conically and the bottom of the circular cone is connected to the center of the conductive plate 31.

Figure 2A:
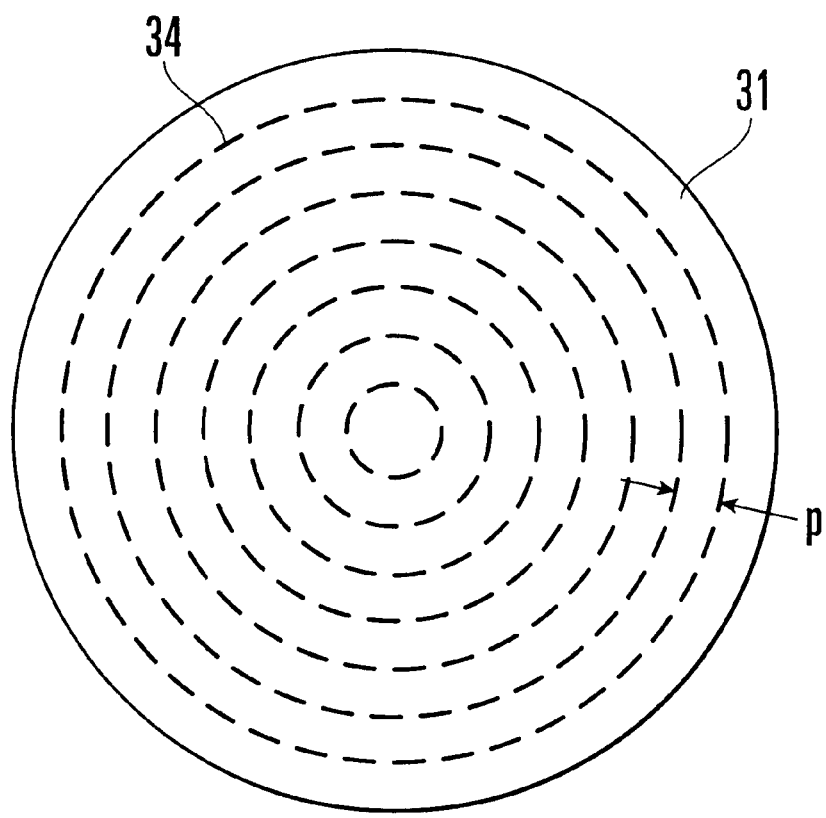
FIGS. 2A and 2B are diagrams showing an example of the construction of a first conductive plate constituting a radiation plane of a radial antenna.
Figure 2B:
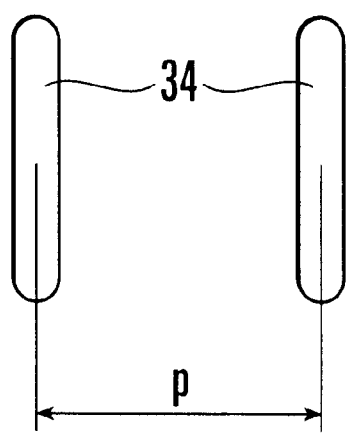

Turning to FIGS. 2A and 2B, an example of structure of the conductive plate 31 forming the radiation plane of the radial antenna 30 will be described. In particular, the whole of the conductive plate 31 is shown, in plan view form, in FIG. 2A and two slots 34 that are adjacent to each other in the radial direction of the conductive plate 31 are shown, in enlarged view form, in FIG. 2B.

As shown in FIG. 2A, many slots 34 each extending substantially in the circumferential direction are formed in the conductive plate 31 concentrically of its center. The radius of the concentric circle increases in an arithmetic progression fashion. The increment of the concentric circle is defined as pitch p between adjacent slots in the radial direction (that is, the propagation direction of the electromagnetic field inside the radial waveguide 36). The pitch p between adjacent slots in the radial direction is set in such a manner that electromagnetic fields are radiated in a direction oblique to the normal direction of conductive plate 31, namely, the vertical direction.

A method of designing the pitch p will be described below. Assumptively, the dielectric plate 13 is sufficiently distant from the radiation plane (conductive plate 31) of the radial antenna 30 to permit the equivalent specific inductivity $\epsilon_a$ in the outside of the radial antenna 30 to approximate 1 (one). Under this condition, the specific inductivity $\epsilon_v$ in the inside of radial antenna 30 (that is, in the radial waveguide 36) has a value equal to the ratio $\epsilon_r$ between $\epsilon_v$ and $\epsilon_a$ (=$\epsilon_v/\epsilon_a$).

Figure 3:
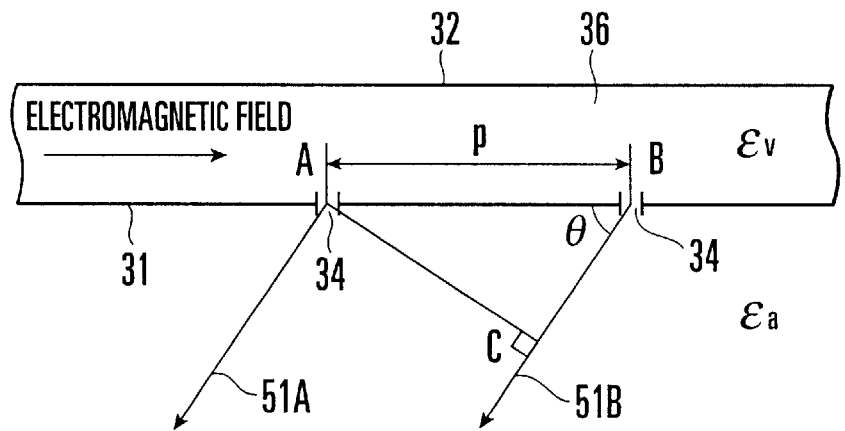
FIG. 3 is a diagram for explaining a method of designing pitch p between adjacent slots in the radial direction of the first conductive plate.

FIG. 3 is a diagram useful to explain the method of designing the pitch p between adjacent slots in the radial direction. The radiation direction of electromagnetic field is a direction in which radiated electromagnetic fields intensify mutually. With reference to FIG. 3, the mutual intensification of electromagnetic fields occurs when an electromagnetic field 51A radiated from a point A is in phase with an electromagnetic field 51B reaching a point C from the point A by way of a point B. The condition for this is given by equation (1).

$$P/\lambda_g + (p\cos\theta)/\lambda = N \tag{1}$$

where $\theta$ is a radiation angle (an angle formed between a direction parallel to the conductive plate 31 and the radiation direction of each electromagnetic field 51A or 51B), $\lambda$ is a wavelength of each of the electromagnetic fields 51A and 51B in vacuum and N is natural number.

The pitch p is now defined pursuant to equation (2).

$$P = \alpha_g \lambda (\alpha > 0) \tag{2}$$

The wavelength $\lambda_g$ of the electromagnetic field propagating in the radial waveguide 36 of specific inductivity $\epsilon_v$ is indicated by $$\lambda_g = \lambda/\epsilon_v^{1/2} = \lambda/\epsilon_r^{1/2} \tag{3}$$

and therefore, by substituting equations (2) and (3) to equation (1), reduced equation (4) can be obtained as follows:

$$\cos\theta = \epsilon_r^{1/2}\{(N/\alpha)-1\} \tag{4}$$

From equation (4), $\epsilon_r$, N and $\alpha$ must satisfy the relation $$-1 \leq \epsilon_r^{1/2}\{(N/\alpha)-1\} \leq 1 \tag{5}$$

At that time, the electromagnetic field 51A is in phase with the electromagnetic field 51B at an angle $\theta$ given by $$\theta = \cos^{-1}[\epsilon_r^{1/2}\{(N/\alpha)-1\}] \tag{6}$$

and the electromagnetic fields are radiated in this direction.

But when N=$\alpha$ holds in equation (4), there results $\cos\theta=0$ or $\theta=(2M-1)\pi/2$ (M being natural number), indicating that the electromagnetic fields 51A and 51B are radiated in the vertical direction. Accordingly, by designing the pitch p between adjacent slots in the radial direction in such a manner that equation (5) is met together with N≠$\alpha$, the electromagnetic fields can be radiated in a direction oblique to the vertical direction.

A concrete example will be described hereunder. Firstly, a case where a dielectric member 39 made of $Al_2O_3$ ($\epsilon_v = \epsilon_r \approx 9$) is placed in the radial waveguide 36 will be described.

Equation (5) can be reduced to $$N/\{1+(1/\epsilon_r^{1/2})\} \leq \alpha \leq N/\{1-(1/\epsilon_r^{1/2})\} \tag{7}$$

and therefore, for $\epsilon_r=9$, the relation between N and $\alpha$ is indicated by $$\frac{3}{4} \times N \leq \alpha \leq \frac{3}{2} \times N \tag{8}$$

Figure 4:
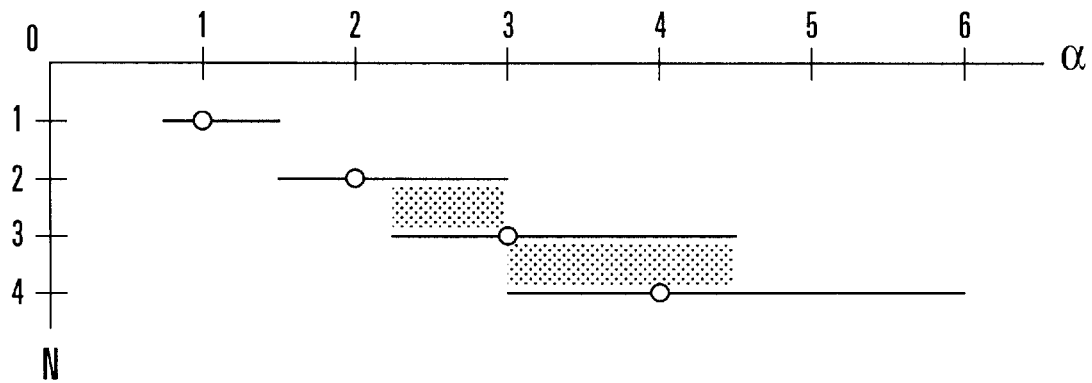
FIG. 4 is a bar graph showing the relation between N and $\alpha$ for specific inductivity $\epsilon_r \approx 9$.

FIG. 4 is a bar graph showing the relation between N and $\alpha$ prescribed by equation (8). Since the vertical radiation is set up for N=$\alpha$ as described previously, points indicative of N=$\alpha$ are indicated by circular blank so as to be excluded.

In FIG. 4, the radiation angle $\theta$ becomes acute for $\alpha<N$ (on the left side of the circular blank in each bar) and becomes obtuse for $\alpha>N$ (on the right side of the circular blank in each bar). Accordingly, in a range where individual bars overlap each other (meshed portion), the electromagnetic fields are radiated in acute and obtuse angle directions. At the left end of each bar, the radiation angle $\theta$ is 0° and at the right end of each bar, the radiation angle $\theta$ is 180°, so that the radiated electromagnetic fields propagate along the conductive plate 31.

Figure 5:
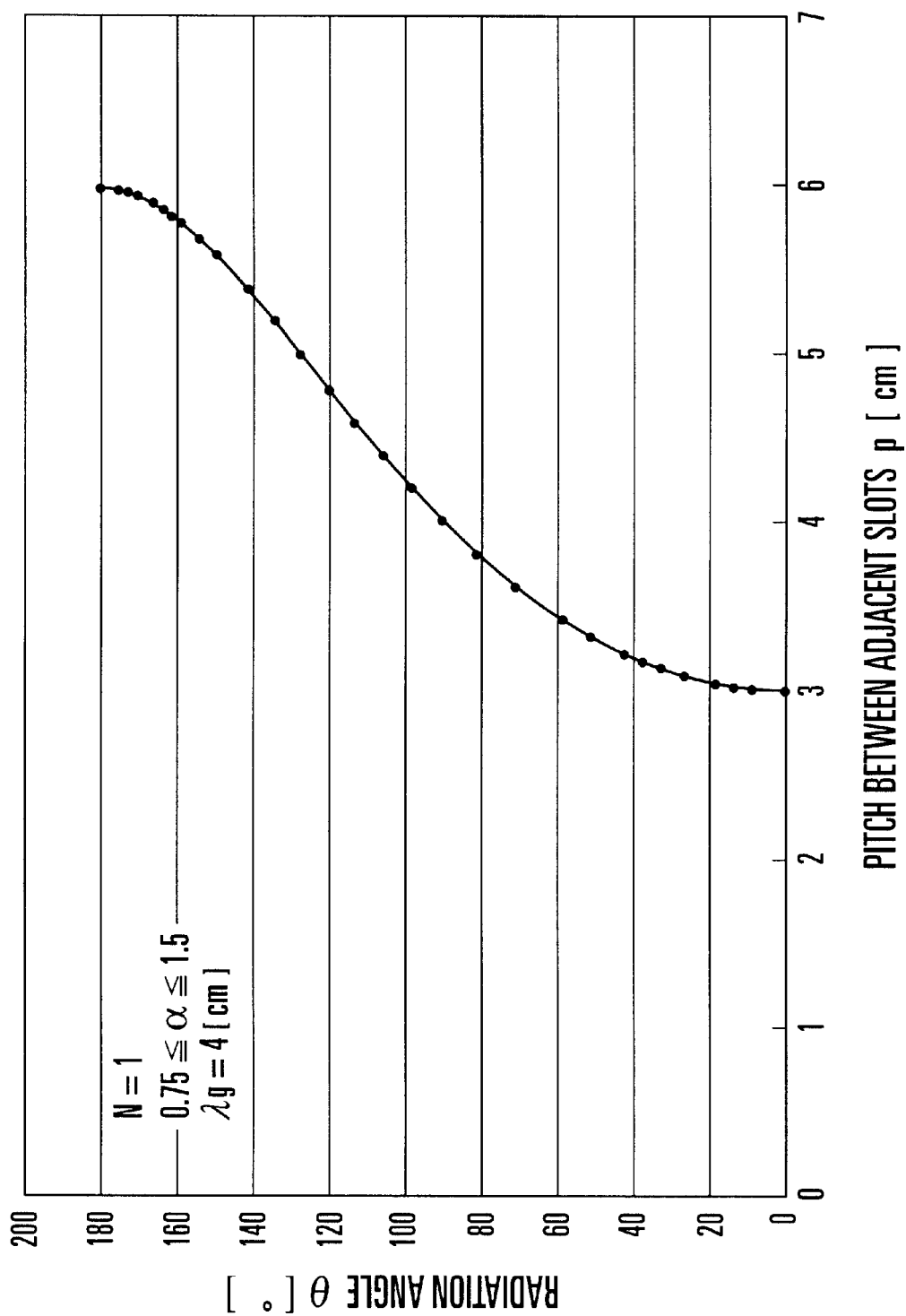
FIG. 5 is a graph showing an example of the dependency of radiation angle $\theta$ on the slot pitch p when specific inductivity $\epsilon_r \approx 1$ stands.

As $\alpha$ increases, the pitch p between slots increases pursuant to equation (2) and the number of slots 34 formable in the conductive plate 31 decreases correspondingly, thereby reducing the efficiency of radiation of electromagnetic fields. Therefore, from the practical point of view, it is preferable that N=1, $0.75 \leq \alpha \leq 1.5$ and $\alpha \neq 1$ be satisfied. FIG. 5 is a graph showing the dependency of the radiation angle $\theta$ upon the slot pitch p under this condition when the guide wavelength $\lambda_g$ is 4 [cm], where abscissa represents the pitch p [cm] between adjacent slots and ordinate represents the radiation angle $\theta$[°].

Next, a case where any dielectric member 39 is not disposed in the radial waveguide 36, that is, air ($\epsilon_v = \epsilon_r \approx 1$) prevails in the radial waveguide 36 will be described. When $\epsilon_r \approx 1$ stands, equation (5) can be reduced to $$-1 \leq (N/\alpha)-1 \leq 1, \tag{9}$$

that is, $$\alpha \geq N/2 \tag{10}$$

Figure 6:
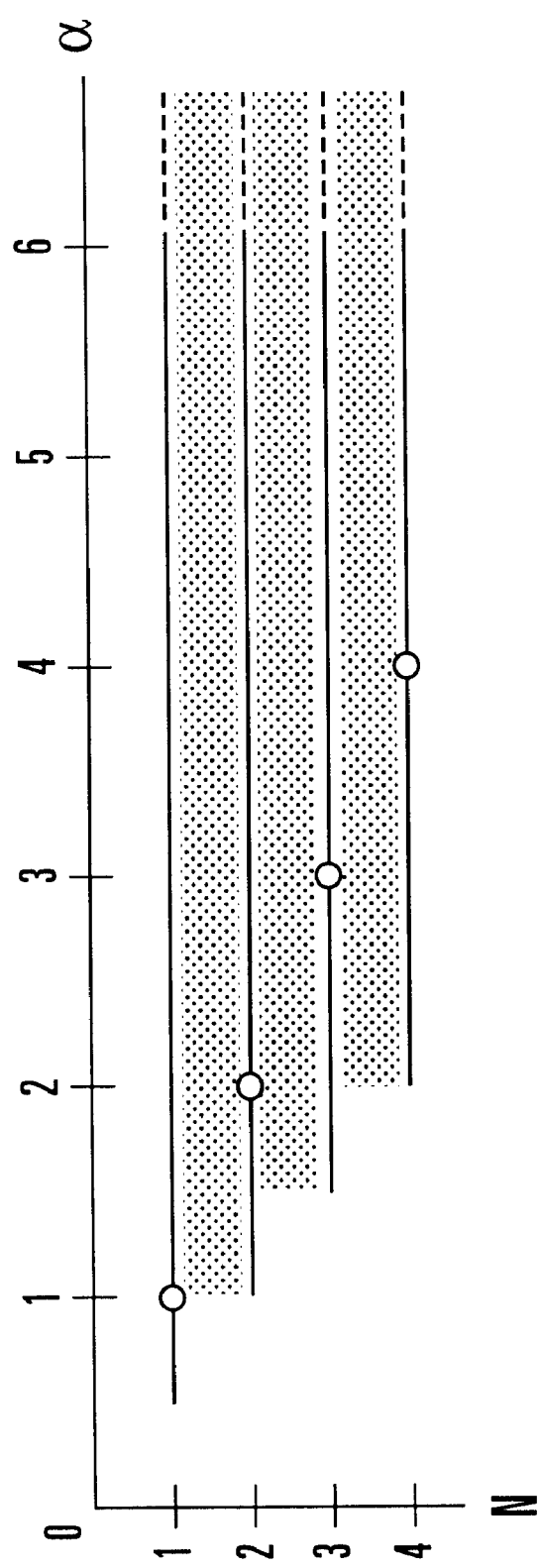
FIG. 6 is a bar graph showing the relation between N and $\alpha$ for specific inductivity $\epsilon_r \approx 1$.

FIG. 6 is a bar graph showing the relation between N and $\alpha$ prescribed by equation (10). As described above, for N=$\alpha$, the vertical radiation occurs and points indicative of N=$\alpha$ are indicated by circular blank so as to be excluded.

In FIG. 6, the radiation angle $\theta$ becomes acute for $\alpha<N$ (on the left side of the circular blank in each bar) and becomes obtuse for $\alpha>N$ (on the right side of the circular blank in each bar). In a range where the individual bars overlap each other (meshed portions), the electromagnetic fields are radiated in plural directions. In each bar, the radiation angle $\theta$ is 0° at the left end and the radiation angle $\theta$ is 180° at the right end (not shown), so that the radiated electromagnetic fields propagate along the conductive plate 31.

Figure 7:
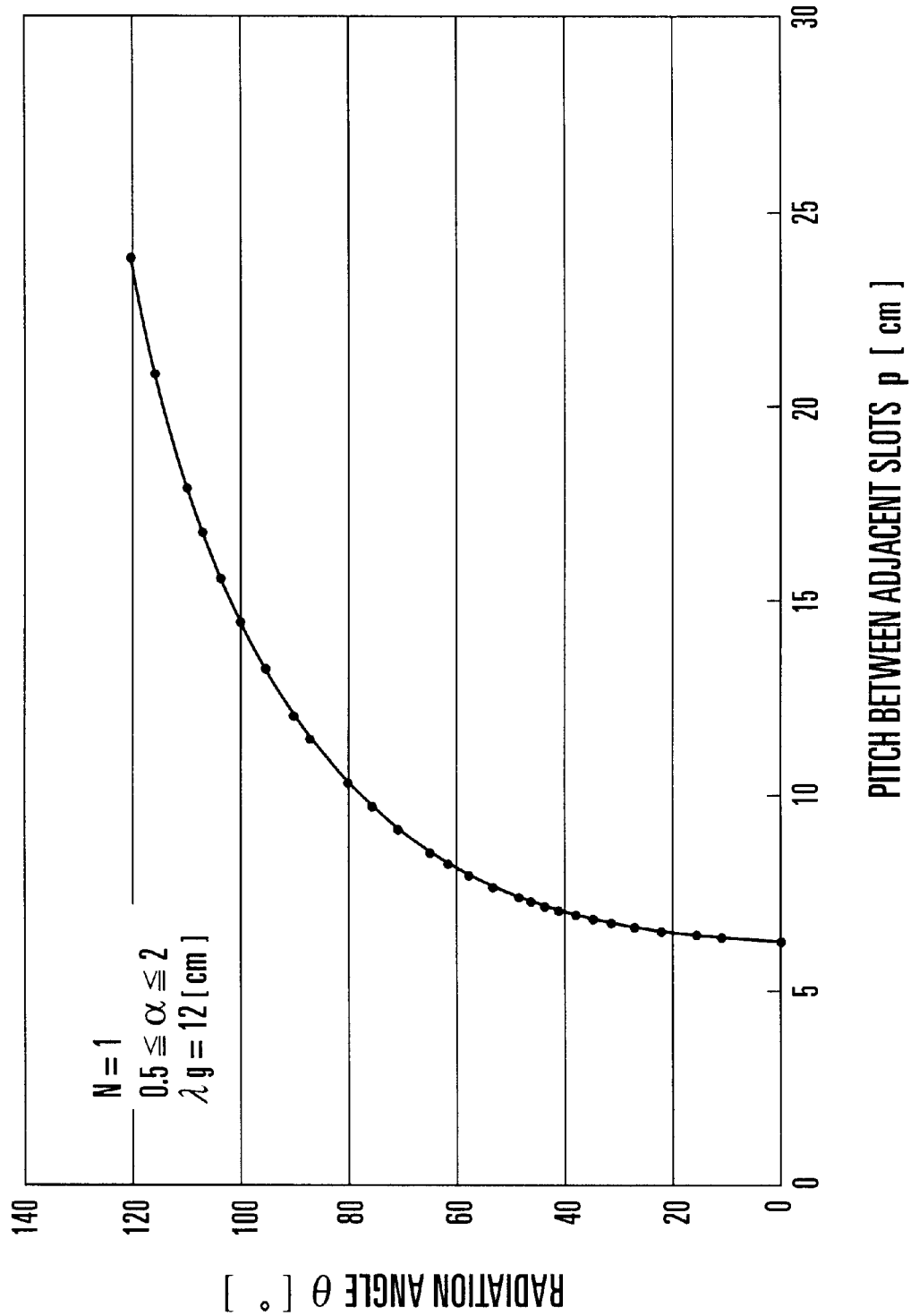
FIG. 7 is a graph showing an example of the dependency of radiation angle $\theta$ on the slot pitch p for specific inductivity $\epsilon_r \approx 1$.

For the same reasons as those described in connection with the aforementioned example, N=1, $0.5 \leq \alpha \leq 2$ and $\alpha \neq 1$ may preferably be set from the practical viewpoint. FIG. 7 is a graph showing dependency of the radiation angle $\theta$ upon the slot pitch p under this condition the when the guide wavelength $\lambda_g$ is 12 [cm], where abscissa represents the pitch p [cm] between adjacent slots and ordinate represents the radiation angle [°].

Figure 8A:
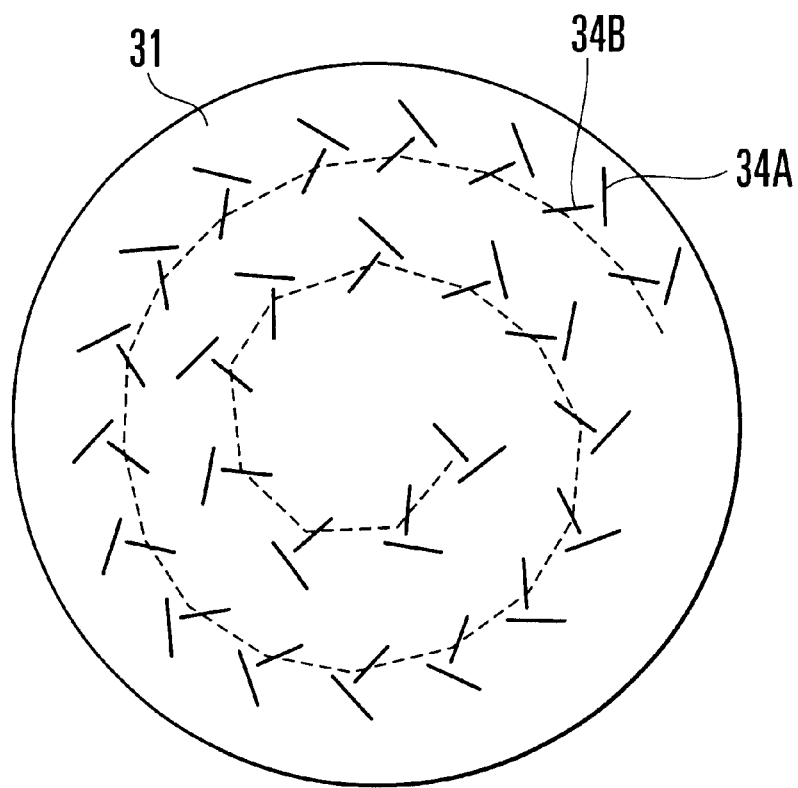
FIGS. 8A and 8B are diagrams showing another example of construction of the first conductive plate constituting the radiation plane of the radial antenna.

Alternatively, paired slots 34A and 34B may be formed in a ")("-letter shape in the conductive plate 31 constituting the radiation plane of the radial antenna 30, as shown in FIG. 8A. In this case, where the center of the conductive plate 31 is indicated by O, the centers of two slots 34A, which are adjacent substantially in the radial direction, are indicated by 34A1 and 34A2, respectively, and the centers of two slots 34B, adjacent substantially in the radial direction, are indicated by 34B1 and 34B2, respectively, the difference between O-34A1 distance and O-34B1 distance is set to nearly $\lambda_g/4$. This holds true for the centers 34A2 and 34B2. Then, the aforementioned pitch p between adjacent slots in the radial direction is defined by the difference between O-34A1 distance and O-34A2 distance or the difference between O-34B1 distance and O-34B2 distance. By designing the thus defined pitch such that the aforementioned equation (5) is satisfied along with N≠α, electromagnetic fields can be radiated in a direction oblique to the normal direction of the conductive plate 31. In this case, the paired slots 34A and 34B may be formed spirally as shown in FIG. 8A.

The etching apparatus shown in FIG. 1 operates as will be describe below.

With the substrate 21 carried on the upper surface of the carriage 22, the interior of the process container 11 is evacuated to a degree of vacuum of, for example, about 0.01 to 10 Pa. While maintaining this vacuum degree, Ar serving as a plasma gas is supplied from the plasma gas supply nozzle 15 and $CF_4$ serving as an etching gas is supplied under the flow-rate control from the process gas supply nozzle 16.

Under the condition that the plasma gas and etching gas are supplied to the interior of the process container 11, the high-frequency electromagnetic field from the high-frequency generator 45 is supplied to the radial antenna 30 via the rectangular waveguide 43, rectangular/coaxial converter 42 and coaxial line 41.

As the electromagnetic field supplied to the radial antenna 30 radially propagates from the center to the outer periphery of the radial waveguide 36 constructed of the conductive plate 31 and 32, electromagnetic fields are radiated bit by bit through the many slots 34 formed in the conductive plate 31. Since the pitch p between adjacent slots in the radial direction of the conductive plate 31 is so designed as to satisfy the aforementioned equation (5) together with N≠α, the electromagnetic fields are radiated in a direction oblique to the normal direction of conductive plate 31 (Z-axis direction in FIG. 1). The conductive plate 31 is disposed in parallel with the dielectric plate 13 and hence the electromagnetic fields are radiated in a direction oblique to the normal direction of dielectric plate 13 (Z-axis direction in FIG. 1).

The high-frequency electromagnetic fields transmit through the dielectric plate 13 so as to be admitted to the interior of the process container 11. In the process container 11, the electromagnetic fields form electric fields that ionize Ar to generate plasma in a space S1 above the substrate 21 representing an object to be processed.

In the etching apparatus, the carriage 22 is biased with negative potential to extract ions from the generated plasma in order to apply an etching process to the substrate 21.

Figure 20:
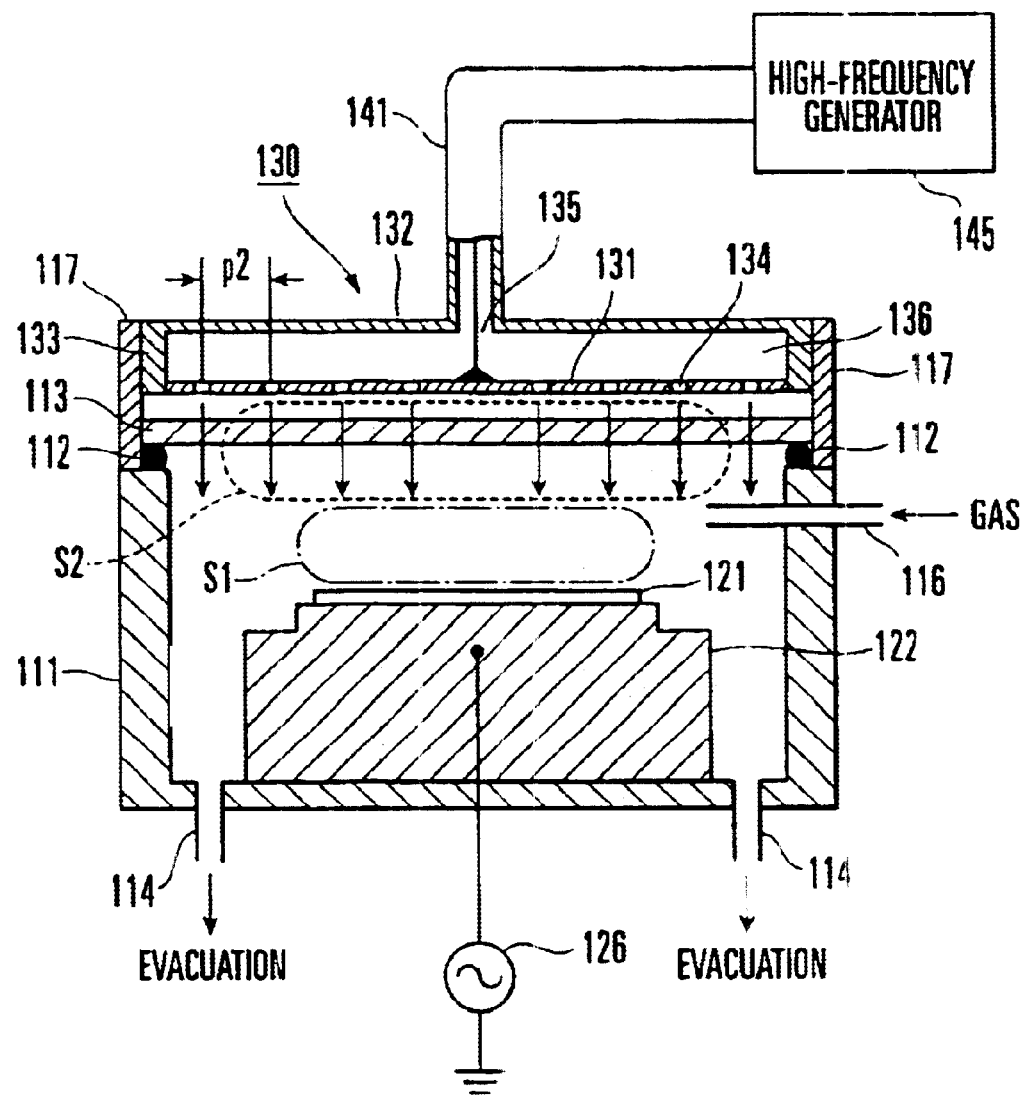
FIG. 20 is a diagram showing the construction of an etching apparatus using a conventional high-frequency plasma processing apparatus.

Next, effects of the etching apparatus shown in FIG. 1 will be described in comparison with those attained with the conventional etching apparatus shown in FIG. 20. To examine distribution of plasmas generated in the etching apparatus shown in FIGS. 1 and 20, the plasmas were photographed. FIGS. 9A, 9B and 9C are diagrams for explaining devices used for photographing. Especially, FIG. 9A is a sectional view showing geometrical dimensions of the radial antenna 130 of the etching apparatus shown in FIG. 20, FIG. 9B is a sectional view showing geometrical dimensions of the radial antenna 30 of the etching apparatus shown in FIG. 1 and FIG. 9C is a diagram showing the disposition of a CCD camera.

For photographing plasma, a CCD camera 29 is disposed in the center of the carriage 22 or 122 removed of the substrate 21 or 121 and the plasma generation space S1 set up when electromagnetic fields having a guide wavelength $\lambda_g$ of about 4 cm are radiated to the interior of the process container 11 or 111 was photographed. At that time, a radial antenna 130 having geometrical dimensions as shown in FIG. 9A was used for the conventional etching apparatus. More particularly, the conductive plate 131 has a diameter of 48 cm and a thickness of 0.03 cm, the pitch p2 between adjacent slots in the radial direction is 4 cm (=$\lambda_g$) and the ring member 133 has a height of 0.5 cm. For the etching apparatus shown in FIG. 1, a radial antenna 30 having geometrical dimensions as shown in FIG. 9B was used. More particularly, the diameter of the conductive plate 31 and the height of the ring member 33 are dimensioned identically to those of the aforementioned radial antenna 130 and the pitch p between adjacent slots in the radial direction of the conductive plate 31 is 3.8 cm (=0.875 $\lambda_g$).

FIGS. 10A and 10B are schematic diagrams of images obtained when photographing is conducted under conditions as above. Especially, FIG. 10A shows an image obtained with the etching apparatus shown in FIG. 20 and FIG. 10B shows an image obtained with the etching apparatus shown in FIG. 1. As shown in FIG. 10A, in the case of the conventional etching apparatus using the radial antenna 130 having the pitch p2=$\lambda_g$ between adjacent slots, the portions 161A and 161B at which plasma is generated at a high density are observed near the center of the plasma generation region 160. Contrary to this, in the case of etching apparatus shown in FIG. 1 using the radial antenna having the pitch p=0.8752$\lambda_g$ between adjacent slots, the portions 161A and 161B where plasma is generated at a high density are eliminated in a plasma generation region 60 and plasma distributed uniformly can be observed as shown in FIG. 10B.

As will be seen from the above, when compared with the conventional etching apparatus, the etching apparatus shown in FIG. 1 can permit the uniformly distributed plasma to be generated, thus attaining the effect that spots of etching which spot the substrate 21 can be suppressed.

Next, reasons why the distribution of plasma can be improved by using the radial antenna 30 constructed as shown in FIG. 1 will be described.

Similarly to the conventional etching apparatus, some of the electromagnetic fields admitted from the radial antenna 30 to the process container 11 are not absorbed during plasma generation to form standing waves in a space S2 between the radial antenna 30 and the plasma generation space S1 and electric fields of the standing waves participate in the generation of plasma. Accordingly, even in the etching apparatus shown in FIG. 1, it can be said that both the electric fields of the electromagnetic fields directly coming into the plasma from the radial antenna 30 and the electric fields of the standing waves formed inside the process container 11 take part in the plasma generation.

Figure 11A:
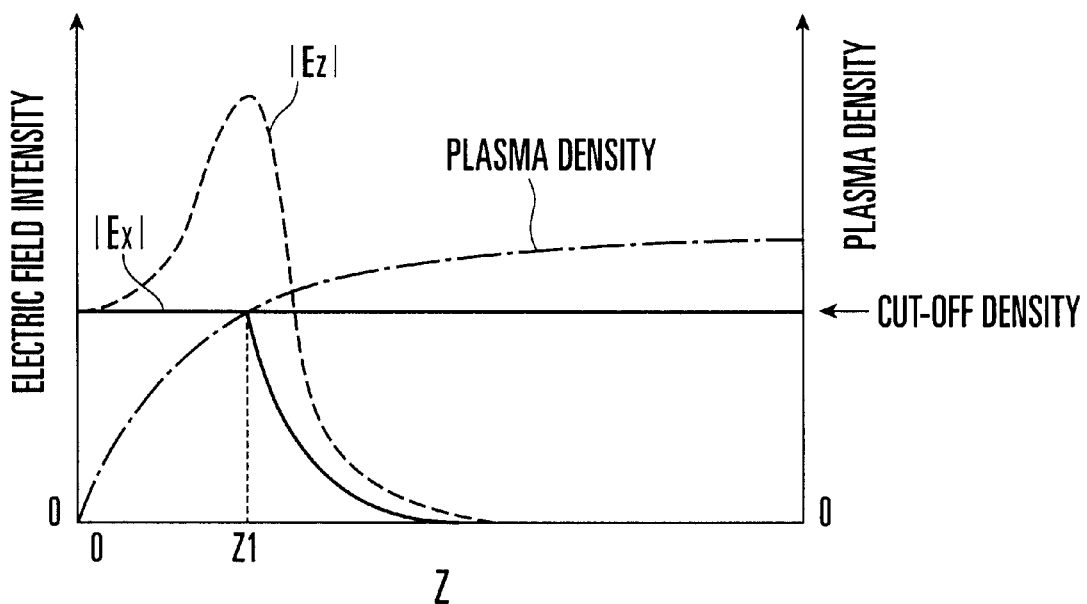
FIGS. 11A and 11B are conceptual diagrams showing a change in density of plasma having a plasma plane vertical to the Z-axis direction and a change in intensity of high-frequency electric field incident upon plasma.
Figure 11B:
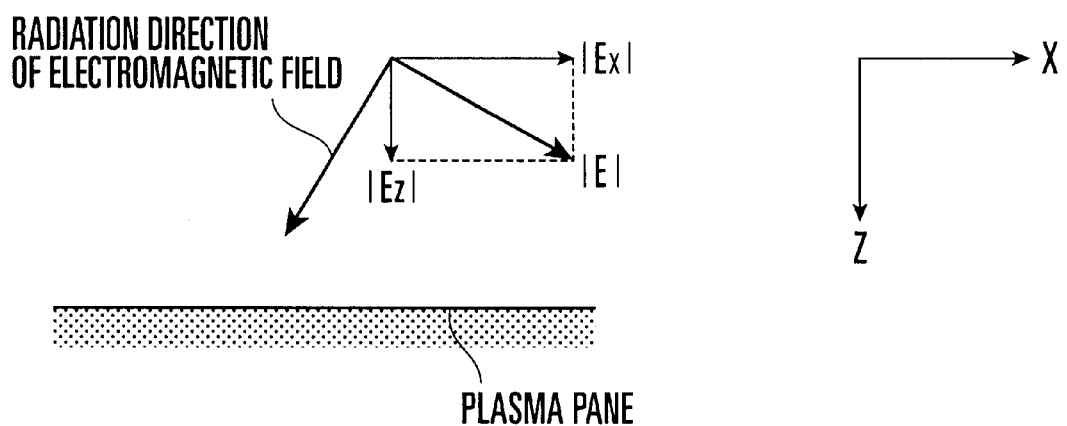

FIGS. 11A and 11B are conceptual diagrams showing a change in density of plasma having a plasma plane vertical to the Z-axis direction (the vertical direction in FIG. 1) and a change in electric field intensity of the electromagnetic field coming into the plasma. In FIG. 11A, abscissa represents the Z-axis direction distance extending from the boundary plane between plasma and dielectric plate 13 and ordinate represents the plasma density and electric field intensity. With X-axis set up vertically to the Z axis, solid line indicates the intensity of an X-axis direction component (that is, a component in a direction parallel to the plasma plane) Ex of electric field E of the electromagnetic field, dotted line indicates the intensity of a Z-axis direction component (that is, a component in the normal direction of the plasma plane) Ez of electric field E of the electromagnetic field and dotted and chained line indicates the plasma density.

The density of plasma having the plasma plane vertical to the Z axis rises, as shown at dotted and chained line in FIG. 11A, as the Z-axis direction distance from the boundary plane between the plasma and dielectric plate 13 increases. For a certain frequency, the dielectric constant of plasma becomes zero at a density and this density is called a cut-off density at that frequency.

When the electromagnetic field as shown in FIG. 11B comes into the plasma as above in a direction oblique to the Z-axis direction, the intensity of X-axis direction component Ex of the electric field can keep a substantially constant value before the plasma density reaches the cut-off density at a point Z1, as shown at solid line in FIG. 11A but when the point Z1 is exceeded, the intensity decreases exponentially. In contrast therewith, the intensity of Z-axis direction component of the electric field rises immediately after the electromagnetic field comes into the plasma, reaches a maximum at the point Z1 and then changes to decrease, as shown at dotted line in FIG. 11A. This principle is described in "Amplification and Absorption of Electromagnetic Waves in Overdense Plasmas" by R. B. White and F. F. Chen, Plasma Physics, Vol. 16, pp. 565–587.

When the electromagnetic fields are caused to be incident in the direction oblique to the Z-axis direction (that is, the normal direction of the plasma plane), a Z-axis direction component Ez of the electric field takes place and in comparison with the case where the electromagnetic fields are caused to be incident in the Z-axis direction, the electric field intensity based on a resultant electric field of the two components Ex and Ez can be larger.

In the etching apparatus shown in FIG. 1, the electromagnetic fields from the radial antenna 30 are radiated in the direction oblique to the vertical direction (Z-axis direction) so as to be incident upon the dielectric plate 13 at a predetermined angle to the normal direction (Z-axis direction) of the dielectric plate 13 disposed horizontally. On the other hand, the plasma generation space S1 in the process container 11 is constrained by the dielectric member 13, so that the plasma plane opposing the dielectric plate 13 is shaped to extend along the dielectric plate 13, taking the form of a horizontal plane. Accordingly, the electromagnetic fields radiated from the radial antenna 30 are caused to be incident in a direction oblique to the normal direction (Z-axis direction) of the plasma plane opposing the dielectric plate 13.

Thus, grounded on the aforementioned principle, the electric field larger than that in the conventional apparatus can be formed in the plasma generation space S1 by using the radial antenna 30 and hence the efficiency of plasma generation due to the electric fields of the electromagnetic fields directly coming from the radial antenna 30 can be improved. Through this, the electric fields of the electromagnetic fields directly coming from the radial antenna 30 greatly contribute to the plasma generation and the participation of the electric fields of the standing waves formed in the space S2 inside the process container 11 to the plasma generation is relatively suppressed.

Generation of plasma due to the electric field of the electromagnetic fields directly coming into the plasma from the radial antenna 30 can be controlled relatively easily. For example, when the length of each slot formed in the radiation plane (conductive plate 31) is adjusted in the radial direction to suitably adjust the intensity of the electric field radiating from each slot, the generation of plasma can be controlled. Contrary to this, the generation of plasma due to the electric fields of the standing waves is difficult to control. In the etching apparatus shown in FIG. 1, the plasma generation attributable to the electric fields of the directly incident electromagnetic fields can be dominant over the plasma generation attributable to the electric fields of the standing waves as described above, thereby making it possible to control the plasma generation such that desired plasma distribution can be established. For the reasons as above, the uniform plasma distribution as shown in FIG. 10B can be obtained.

Figure 12:
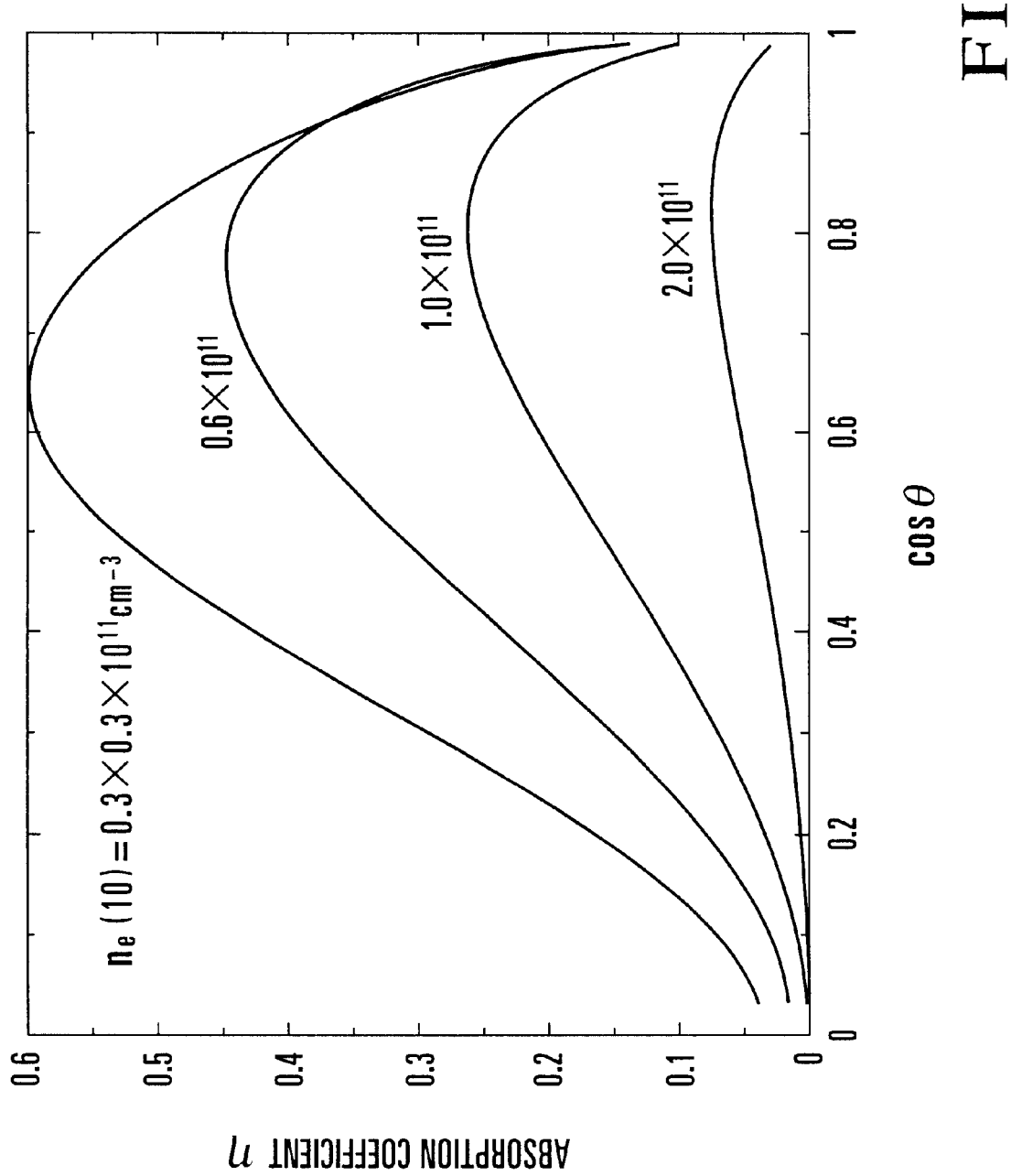
FIG. 12 is a graph showing the dependency of the absorption coefficient of electromagnetic field on the angle.

FIG. 12 is a graph showing dependency of the absorption coefficient of electromagnetic field upon angles, where abscissa represents cosine of radiation angle θ (see FIG. 3) of the electromagnetic field and ordinate represents absorption coefficient η. It will be seen from this figure that though depending on electron density $n_e$ in plasma, the absorption coefficient is maximized at a radiation angle θ of about 30° to 50°. Accordingly, by radiating the electromagnetic fields at the angle θ as above, the plasma generation due to the electromagnetic fields directly incident from the radial antenna 30 becomes dominant to permit accurate control of the plasma distribution.

The pitch p between adjacent slots may either be constant or variable in the radial direction (that is, in the propagation direction of the electromagnetic field inside the radial waveguide 36). With the pitch p between adjacent slots varied in the radial direction, the radiation direction of the electromagnetic field varies in the radial direction. As will be seen from FIG. 12, when the radiation direction of the electromagnetic field changes, the absorption coefficient of the electromagnetic field also changes and therefore the plasma distribution can be adjusted by controlling the generation efficiency of plasma in the radial direction.

Figure 13:
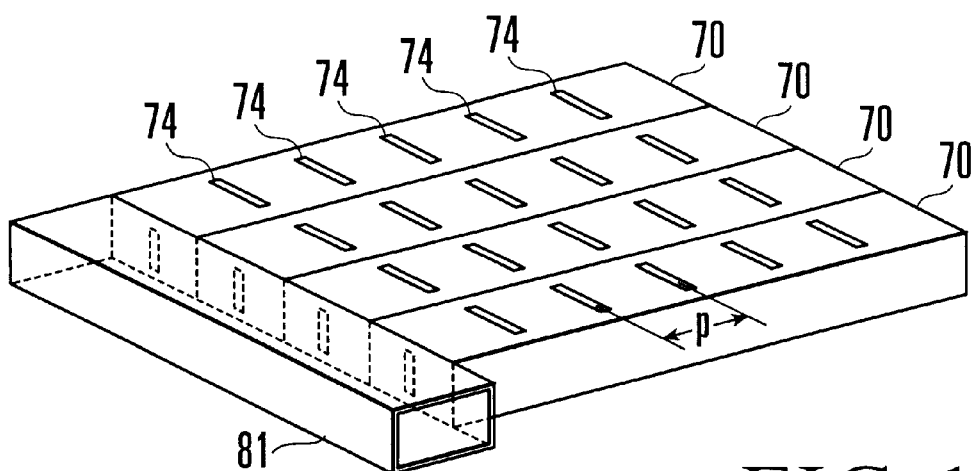
FIG. 13 is a perspective view showing the construction of a rectangular waveguide antenna array usable in the invention.

The example using the radial antenna 30 has been set forth but this is not limitative and similar effects can be obtained by using another type of slot antenna, for example, a rectangular waveguide antenna FIG. 13 is a perspective view showing the construction of a rectangular waveguide antenna array usable for the present invention.

Figure 8B:
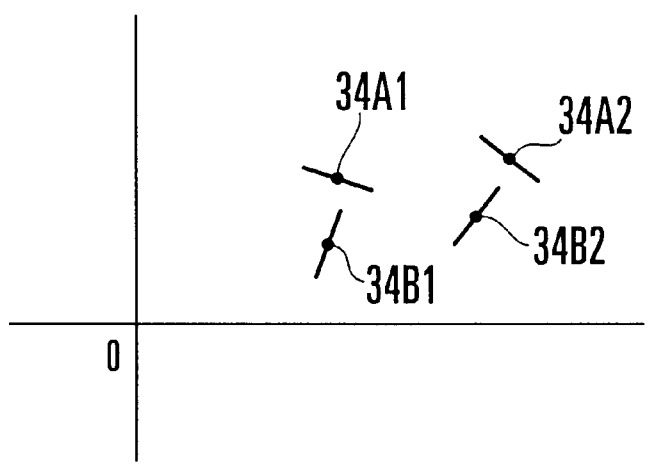

In the antenna array, rectangular waveguide antennas 70 each having a plurality of slots 74 formed in one surface of a rectangular waveguide are sequentially arrayed in its minor side direction. The slots 74 of the rectangular waveguide antenna 70 are formed at intervals of equal distance in the propatation direction of the electromagnetic field inside the rectangular waveguide and pitch p between adjacent slots is so designed as to satisfy the aforementioned equation (5) together with N≠α. The slots may be formed to take the "/\"-letter shape as shown in FIG. 8. The pitch p between adjacent slots may be changed in the propagation direction of the electromagnetic field inside the rectangular waveguide. In FIG. 13, reference numeral 81 designates a rectangular waveguide for electromagnetic field distribution connected to a high-frequency generator (not shown).

Second Embodiment

In the first embodiment, the method for designing the pitch p between slots 34 formed by a great number in the radiation plane (conductive plate 31) of the radial antenna 30 has been described on the assumption that the equivalent specific inductivity $\epsilon_a$ in the outside of the antenna 30 approximates 1 (one) but a description expanded to a general consideration will be given hereunder.

In FIG. 3, the condition for making the electromagnetic field 51A radiated from the point A be in phase with the electromagnetic field 51B reaching the point C from the point A by way of the point B is given by equation (11).

$$p/\lambda_g + (p \cos\theta)/\lambda_a = N \tag{11}$$

where $\lambda_a$ is the wavelength of the electromagnetic waves 51A and 51B propagating in the outside of the antenna 30 and N is integer that is not less than 0.

Given that the wavelength of the electromagnetic field in vacuum is λ, the following equation (12)

$$\lambda_g = \lambda/\epsilon^{1/2}, \quad \lambda_a = \lambda/\epsilon_a^{1/2} \tag{12}$$

is given and by substituting the equation (12) and $p=\alpha\lambda_g$ defined by equation (2) to the equation (11), a reduced equation is obtained as below:

$$\cos\theta=(\epsilon_v/\epsilon_a)^{1/2}\{(N/\alpha)-1\} \quad (13)$$

By putting $\epsilon_v/\epsilon_a=\epsilon_r$ the equation (13) is reduced to $$\cos\theta=\epsilon_r^{1/2}\{(N/\alpha)-1\} \quad (14)$$

From the equation (14), $\epsilon_r$, N and $\alpha$ must satisfy the relation $$-1\leq\epsilon_r^{1/2}\{(N/\alpha)-1\}\leq 1 \quad (15)$$

At that time, the electromagnetic field 51A is in phase with the electromagnetic field 51B in a direction defined by an angle $\theta$ as below:

$$\theta=\cos^{-1}[\epsilon_r^{1/2}\{(N/\alpha)-1\}] \quad (16)$$

and the electromagnetic fields are radiated in this direction.

Accordingly, in connection with the radiation of the electromagnetic fields, the following items can be introduced.

1. When N=0 stands:
   $\theta=\cos^{-1}(-\epsilon_r^{1/2})$ holds and therefore,
   ① in case of $\epsilon_r>1$, any solution does not exist and the electromagnetic field is not radiated;
   ② in case of $\epsilon_r=1$, $\theta=180°$ holds and the electromagnetic fields 51A and 51B are radiated in the horizontal direction; and
   ③ in case of $\epsilon_r<1$, the electromagnetic field is radiated at an angle $\theta$ dependent on $\epsilon_r$.
2. When N is not less than 1 and N=$\alpha$ stands:
   $\cos\theta=0$, that is, $\theta=(2M-1)/\pi/2$ (M being natural number) holds and the electromagnetic fields 51A and 51B are radiated in the vertical direction.
3. When N is not less than 1 and N$\neq\alpha$ stands:
   equation (15) is reduced to obtain the following two equations.

$$N\geq\alpha\{1-(1/\epsilon_r^{1/2})\} \quad (17)$$

$$N\leq\alpha\{1+(1/\epsilon_r^{1/2})\} \quad (18)$$

① for $\epsilon_r>1$,
from equation (17), there results $$\alpha\leq N/\{1-(1/\epsilon_r^{1/2})\} \quad (19)$$

and from equation (18), there results $$\alpha\geq N/\{1+(1/\epsilon_r^{1/2})\} \quad (20)$$

and accordingly, the relation between N and $\alpha$ is indicated by $$N/\{1+(1/\epsilon_r^{1/2})\}\leq\alpha\leq N/\{1-(1/\epsilon_r^{1/2})\} \quad (21)$$

② for $\epsilon_r<1$,
from equation (17), there results $$\alpha\geq N/\{1-(1/\epsilon_r^{1/2})\} \quad (22)$$

where from equation (2), $\alpha>0$
and from equation (18), there results $$\alpha\leq N/\{1+(1/\epsilon_r^{1/2})\} \quad (23)$$

and accordingly, the relation between N and $\alpha$ is indicated by $$0\leq\alpha\leq N/\{1+(1/\epsilon_r^{1/2})\} \quad (24)$$

③ for $\epsilon_r=1$,
from equation (15), there results $$-1\leq(N/\alpha)-1\leq 1 \quad (25)$$

and the relation between N and $\alpha$ is indicated by $$\alpha\geq N/2 \quad (26)$$

From the above, the following can be gathered in connection with the design of the pitch p formed in the radiation plane (conductive plate 31) of the radial antenna 30. More particularly, by designing the pitch p between adjacent slots in the radial direction such that the equation (15) is satisfied, the electromagnetic fields can be radiated at a predetermined angle $\theta$. The radiation angle $\theta$ can be determined by the ratio $\epsilon_r$ between specific inductivities of the inside and outside of the radial antenna 30. But when N is not less than 1 and N=$\alpha$ holds, where $\alpha=p/\lambda_g$, the electromagnetic fields are radiated in a direction vertical to the radiation plane and therefore, when N is not less than 1, by designing the pitch p such that N$\neq\alpha$ holds, the electromagnetic fields can be radiated in a direction oblique to the vertical direction.

As described above, by considering the equivalent dielectric constant $\epsilon_a$ of the outside of radial antenna 30 that changes with working conditions of the plasma apparatus and designing the pitch p on the basis of the ratio $\epsilon_r$ between specific inductivities of the inside and outside of the antenna 30, a suitable slot arrangement can be obtained.

Third Embodiment

Figure 14:
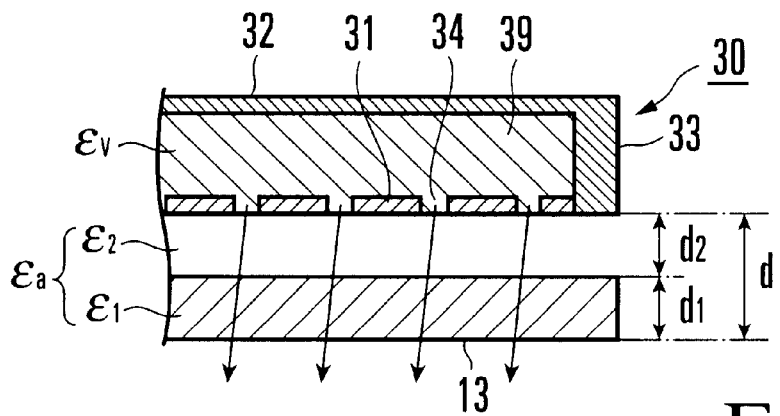
FIG. 14 is an enlarged, fragmentary sectional view showing part of the construction ranging from the radial antenna to dielectric plate shown in FIG. 1 so as to explain a third embodiment of the invention.

Referring now to FIG. 14, there is illustrated, in an enlarged sectional view form, part of construction ranging from the radial antenna 30 to the dielectric plate 13 shown in FIG. 1. In the figure, $d_1$ and $\epsilon_1$ designate the thickness and specific inductivity of the dielectric plate 13, respectively, $d_2$ and $\epsilon_2$ designate the distance and specific inductivity of a space between the dielectric plate 13 and the radiation plane (conductive plate 31) of radial antenna 30, respectively, and $d_1+d_2=d$ stands. In this case, the equivalent specific inductivity $\epsilon_a$ of the outside of radial antenna 30 is determined from $$\epsilon_a=\epsilon_1\epsilon_2/\{\epsilon_1(1-\beta)+\epsilon_2\beta\} \quad (27)$$

where $\beta=d_1/d$ (28)

stands.

Figure 15:
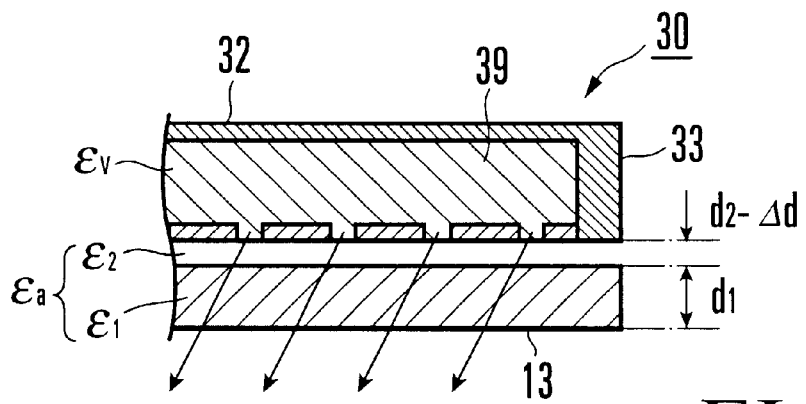
FIG. 15 is a fragmentary sectional view showing the FIG. 14 construction when the distance between the dielectric plate and radial antenna is narrowed.

Now, as shown in FIG. 15, when the distance between the dielectric plate 13 and the radiation plane of radial antenna 30 is reduced by $\Delta d$ from $d_2$, d is also lessened by $\Delta d$ and $\beta$ increases in accordance with equation (28) and for $\epsilon_1\neq\epsilon_2$, $\epsilon_a$ changes. On the other hand, as will be seen from equation (16), the radiation angle $\theta$ is determined by the ratio $\epsilon_r=\epsilon_v/\epsilon_a$ between specific inductivities of the inside and outside of radial antenna 30 and therefore, the radiation angle $\theta$ also changes as $\epsilon_a$ changes. Accordingly, by vertically moving the radial antenna 30 to change the distance from the dielectric plate 13 to the radiation plane of radial antenna 30, the radiation angle $\theta$ can be controlled.

Figure 16:
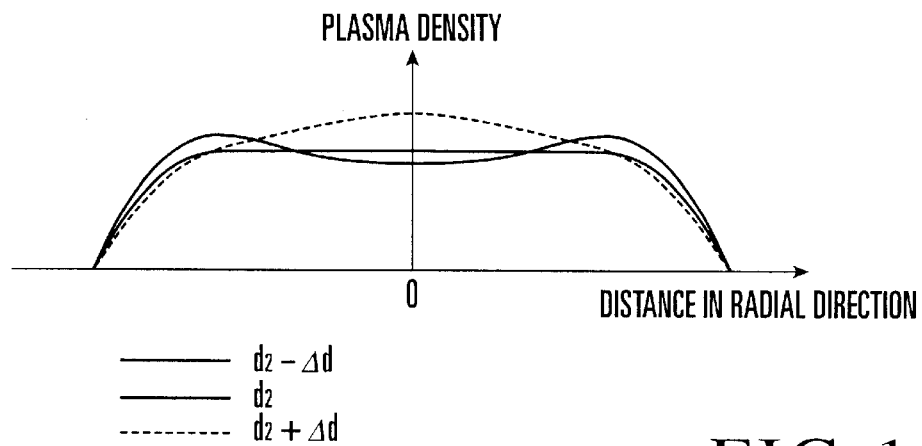
FIG. 16 is a conceptual graph showing changes of plasma distribution when the radial antenna is moved vertically.

FIG. 16 is a conceptual diagram showing changes of plasma distribution when the radial antenna 30 is moved vertically, where abscissa represents the radial distance from the center axis (o) of the process container 11 and ordinate represents plasma density. As will be seen from this graph, by changing the distance between the dielectric plate 13 and the radiation plane of radial antenna 30 from $d_2-\Delta d$ to $d_2+\Delta d$ through $d_2$, where $\Delta d$ is about several mm, the plasma distribution changes correspondingly.

Gathering from the above, by changing the distance between the dielectric plate 13 and the radiation plane of radial antenna 30 to change the radiation direction of the electromagnetic fields, the plasma distribution can be adjusted.

Fourth Embodiment

Figure 17:
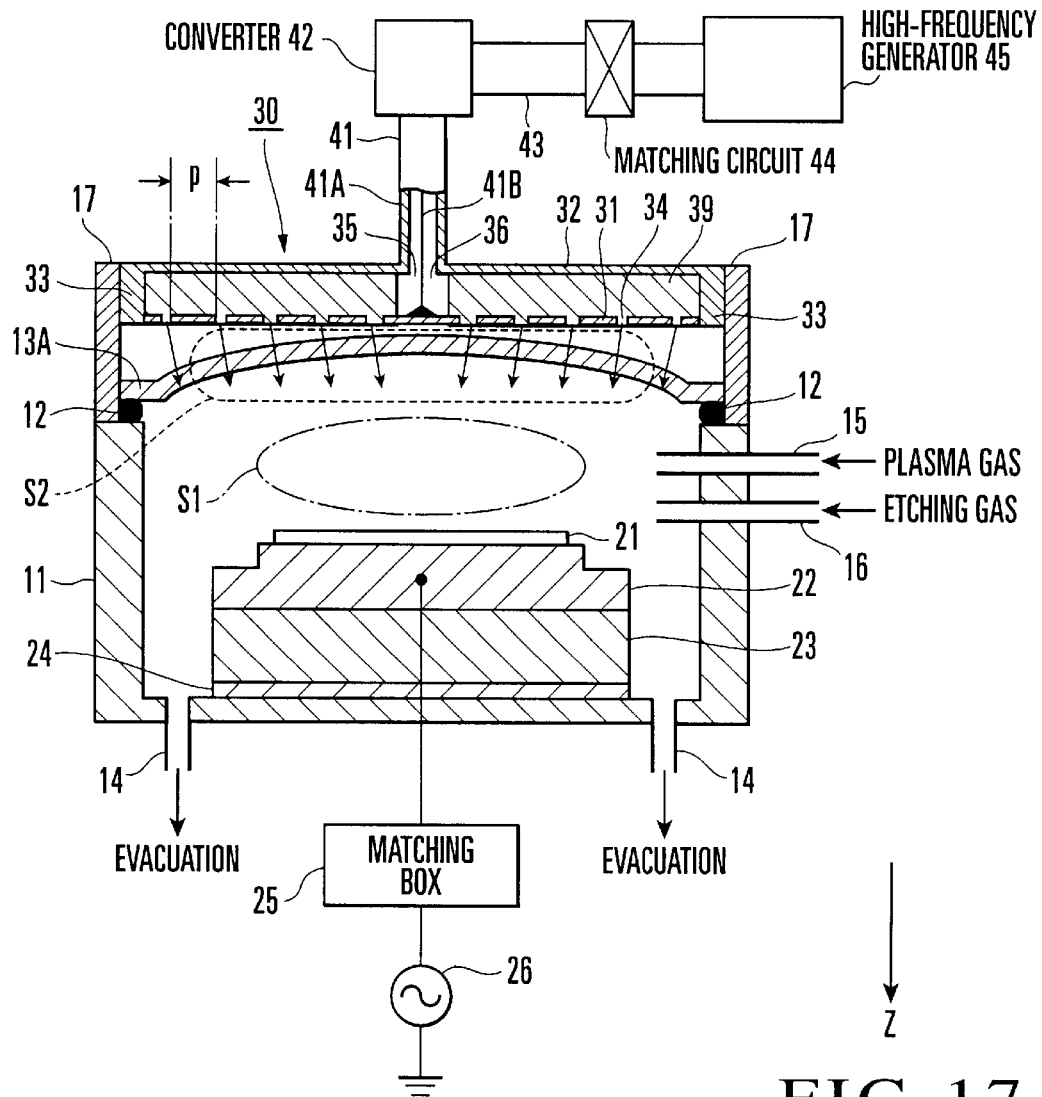
FIG. 17 is a diagram showing the construction of an etching apparatus according to a fourth embodiment of the invention.

Referring to FIG. 17, an etching apparatus according to a fourth embodiment of the invention is constructed as shown therein. In FIG. 17, components identical to those in FIG. 1 are designated by identical reference numerals and their description will be omitted appropriately.

In the present etching apparatus, a dielectric plate 13A disposed to oppose the radiation plane (conductive plate 31) of radial antenna 30 takes the form of a dome. Accordingly, the dielectric plate 13A has a surface oblique to the radiation plane of radial antenna 30. It is to be noted that the dielectric plate 13A is shaped symmetrically to its center axis vertical to the carrying surface of the carriage 22.

Since a plasma generation space S1 inside the process container 11 is constrained by the dielectric plate 13A, the plasma plane opposing the dielectric plate 13A forms a curved surface along the dielectric plate 13A. Except for the neighborhood of the center axis, the normal direction of the plasma plane is oblique to the perpendicular direction (Z-axis direction), with the result that even if an electromagnetic field is radiated in the perpendicular direction (Z-axis direction), the electromagnetic field is incident in a direction oblique to the normal direction of the plasma plane. Thus, by using the dome-shaped dielectric plate 13A, the same condition as that in the etching apparatus shown in FIG. 1 can be set up.

But when shaping a relatively thin dielectric plate of 3 to 30 mm into a dome, the curvature becomes unnecessarily large and a dome-shape of a desired curvature cannot sometimes be obtained. On the other hand, a relatively thick dielectric plate can be used to reduce the curvature but a loss in electromagnetic field increases. Then, when the curvature of the dielectric plate 13A is unnecessarily large, a radial antenna 30 for radiating the electromagnetic field in a direction oblique to the normal direction of the radiation plane (conductive plate 31) may preferably be used to reduce the angle of incidence of the electromagnetic field upon the dielectric plate 13A. By adjusting the distribution of electric field intensity inside the process container 11 in this manner, the plasma distribution can be improved. The plasma distribution can also be adjusted by changing the pitch p between adjacent slots in the radial direction to make the radiation direction of the electromagnetic field distributed in the radial direction.

It suffices that the dielectric plate 13A has the surface oblique to the radiation plane (conductive plate 31) of radial antenna 30, and therefore, another shape such as a conical shape that is convex upwardly or downwardly may be employed.

Fifth Embodiment

Figure 18:
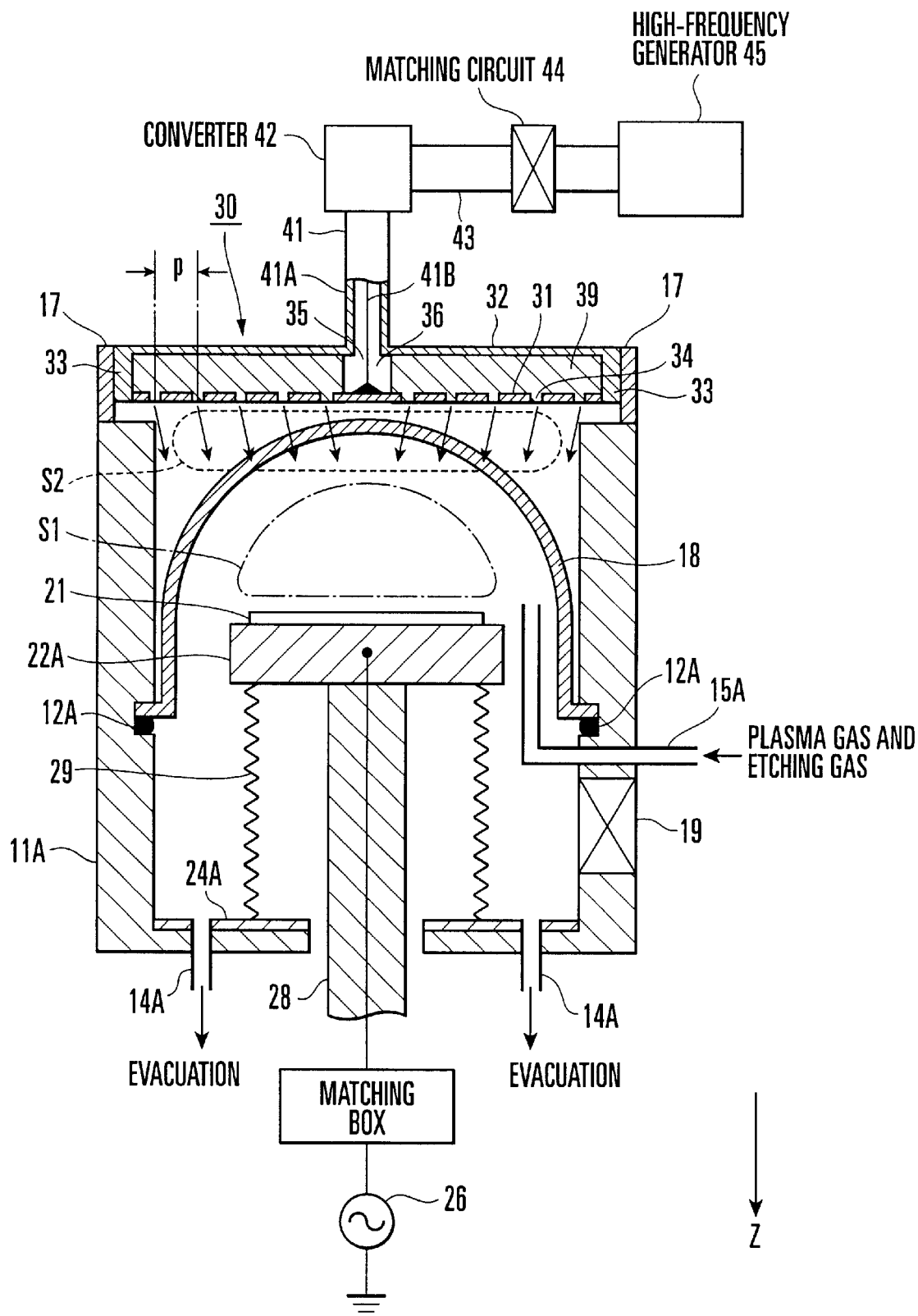
FIG. 18 is a diagram showing the construction of an etching apparatus according to a fifth embodiment of the invention.

Referring to FIG. 18, an etching apparatus according to a fifth embodiment of the invention is constructed as shown therein. In FIG. 18, identical components to those in FIGS. 1 and 17 are designated by identical reference numerals and their description will be omitted appropriately.

The present etching apparatus has, in place of the dome-shaped dielectric plate 13A, a semi-spherical or dome-shaped bell jar 18 for covering the periphery of the substrate 12 elevated up to a process position. Specifically, the bell jar is constructed such that when the semi-spherical or dome-shaped bell jar 18 is put to cover the process position from above with its opening facing downward, the peripheral edge of the opening of the bell jar 18 is fixed to the sidewall of a process container 11A at a level below the process position. Accordingly, part of the sidewall of process container 11A near a space where plasma exists at a relatively high density is isolated from a carriage 22A by means of the bell jar 18. The bell jar 18 is made of a dielectric material such as quartz glass or ceramics (such as $Al_2O_3$ or AlN) of about 3 to 30 mm thickness. The process container 11A is jointed to the bell jar 18 through the medium of a sealing member 12A such as O-ring.

The carriage 22A for carrying the substrate 21 is supported by an ascent and descent shaft 28 loosely passing through the bottom of the process container 11A so as to be movable vertically. When the substrate is brought in/out through a bring in/out port 19, the carriage 22A is lowered downwards and when an etching process is carried out, the carriage 22A is lifted to place the substrate 21 at the process position.

The bottom of the process container 11 is blanketed with an insulating plate 24A made of, for example, ceramics. To assure airtightness of a process chamber defined by the process container 11A and bell jar 18, a bellows 29 enclosing the ascend and descend shaft 28 is provided between the carriage 22A and the insulating plate 24A.

Further, evacuation ports 14A connected to a vacuum pump (not shown) are formed in the bottom of the process container 11A and a nozzle 15A for admitting a plasma gas and an etching gas to the interior of the process chamber is formed in the sidewall of the process container 11A. The nozzle 15A extends up to above the process position so that the gasses may be discharged to a space above the carriage 22A.

As described above, the bell jar 18 has the semi-spherical or dome shape, having a surface oblique to the radiation plane (conductive plate 31) of radial antenna 30. Accordingly, as in the case of the etching apparatus shown in FIG. 17, by adjusting the distribution of electric field intensity in the process chamber through the use of the radial antenna 30 for radiating electromagnetic fields in a direction oblique to the normal direction of the radiation plane, the plasma distribution can be improved.

Since the sidewall of the process container 11A is covered with the bell jar 18 in a region near the space inclusive of plasma generation space S1 where plasma exists at a relatively high density, contamination inside the process chamber caused when the generated plasma contacts the sidewall of the process container 11A to sputter its surface can be suppressed.

Alternatively, the semi-spherical or dome-shaped bell jar can be so constructed as to be carried on the carriage 22A, thereby ensuring that a process chamber can be constructed of the carriage 22A and the bell jar.

Sixth Embodiment

Figure 19:
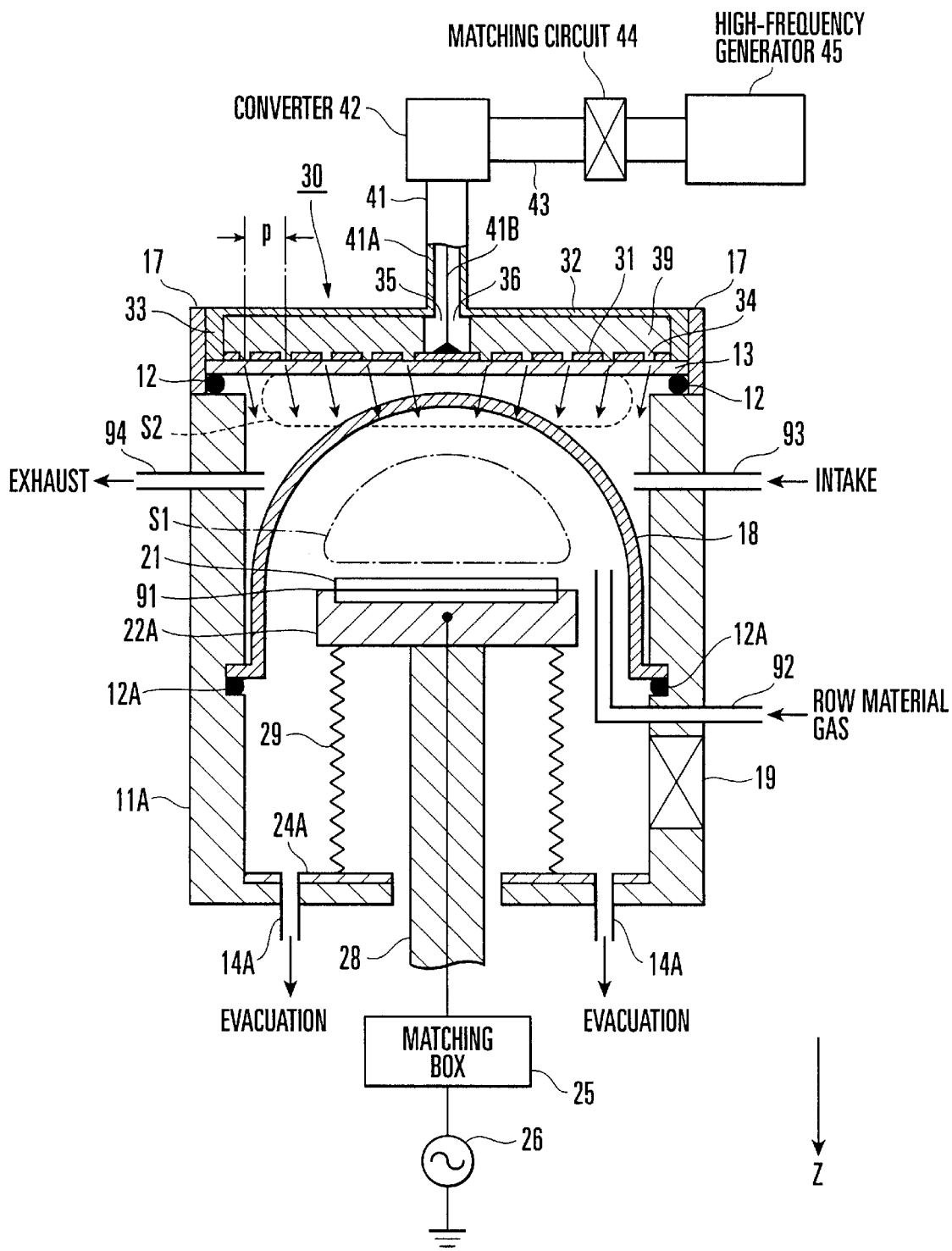
FIG. 19 is a diagram showing the construction of an etching apparatus according to a sixth embodiment of the invention.

In the foregoing, the examples in which the present invention is applied to the etching apparatus have been described but the invention may also be applied to another plasma process apparatus such as a plasma CVD (chemical vapor deposition) apparatus. Then, an example in which the invention is applied to a CVD apparatus will now be described. Referring to FIG. 19, a CVD apparatus according to a sixth embodiment of the invention is constructed as shown therein. In FIG. 19, identical components to those in FIGS. 1 and 18 are designated by identical reference numerals and their description will be omitted appropriately.

The CVD apparatus comprises, in addition to components necessary for the CVD apparatus such as a heater 91 for heating the substrate 21 and a gas supply nozzle 92 for admitting a mixture gas of $SiH_4$ and $H_2$ to the process chamber, the radial antenna 30 for radiating electromagnetic fields in a direction oblique to the normal direction of the radiation plane and the semi-spherical or dome-shaped bell jar 18 (a first dielectric member) for covering the periphery of the substrate 21 elevated to the process position, thus having features similar to those of the etching apparatus shown in FIG. 18.

In the present CVD apparatus, an upper opening of the process container 11A is hermetically closed with the dielectric plate 13 (a second dielectric member). In order that a gas at a predetermined temperature is circulated to a hermetically closed space enclosed by the bell jar 18, dielectric plate 13 and process container 11A for the purpose of adjusting the temperature of the bell jar 18, nozzle 93 and exhaust port 94 representing circulation means are provided, passing through the sidewall of the process container 11A. A gas unapt to absorb the high-frequency electromagnetic field, for example, $N_2$ is used as a gas admitted from the nozzle 92. The temperature of the gas is set to be higher than that in the bell jar 18, having an upper limit of 600° C.

Operation of the CVD apparatus shown in FIG. 19 will be described.

Firstly, under the condition that the substrate 21 is heated with the heater 91 operated to about 150° C., a mixture gas of $SiH_4$ and $H_2$ is admitted to the process chamber from the gas supply nozzle 92. When an electromagnetic field is supplied to the interior of the process chamber from the radial antenna 30, $SiH_4$ is dissociated to $SiH_x$ (x=1, 2, 3, 4) which in turn reacts with the surface of the substrate 21 to form an amorphous Si (hereinafter simply referred to as a-Si) film. At that time, if the bell jar 18 is at the normal temperature, the $SiH_x$ is deposited on the inner surface of the bell jar 18 to form an a-Si film. This a-Si film blocks the admission of the electromagnetic field from the radial antenna 30. But, the bell jar 18 is heated while circulating $N_2$ at a temperature of not greater than 600° C., for example, in the range of 150° C. to 300° C. through the space between the bell jar 18 and the dielectric plate 13, $SiH_x$ becomes unapt to be deposited and as a result, the formation of a-Si film on the inner surface of the bell jar 18 can be suppressed. Accordingly, the loss in the electromagnetic field admitted to the process chamber through the bell jar 18 can be reduced, thereby ensuring that plasma can be generated efficiently for the sake of achieving film formation.

The fluid circulated through the hermetically closed space enclosed with the bell jar 18, dielectric plate 13 and process container 11A is not limited to a gas but may be a liquid. In that case, a liquid unapt to absorb the high-frequency electromagnetic field, for example, GALDEN (Perfluoropolyether: PEPE) or Fluorinert may preferably be used.

The bell jar 18 may be cooled by circulating fluid at a temperature lower than the aforementioned temperature through the hermetically closed space. The temperature of bell jar 18 raised excessively by the action of the electromagnetic field will be a cause of damage of the bell jar 18. With the etching apparatus shown in FIG. 18, a resist on the substrate 21 will sometimes be burnt by radiation heat from the bell jar 18, failing to etch in a desired pattern. But, by cooling the bell jar 18 in this manner, the above problem can be avoided.

When referenced to the bell jar 18, the second dielectric member defining, together with the bell jar 18, the hermetically closed space is disposed on the side opposite to the carriage 22A or substrate 21. Accordingly, the second dielectric member may be filled in a space on the way of the coaxial line 41 serving as a feed line of the radial antenna 30 to form a hermetically closed space. In that case, fluid circulates even through the interior of the radial antenna 30.

As described above, according to the invention, when the electromagnetic fields are radiated to the interior of the process container from the slot antenna, the electromagnetic fields are radiated in a direction oblique to the normal direction of the antenna radiation plane. Through this, the plasma generation due to the electromagnetic fields directly incident from the slot antenna can be predominant over the plasma generation due to the electric fields of standing waves formed in the process container. Since the former can be controlled more easily than the latter, the distribution of plasma can be improved as compared to that in the conventional apparatus.

What is claimed is:

1. A plasma processing apparatus comprising a process container, a carriage housed in said process container and having a surface for carrying an object to be processed, and a slot antenna disposed to oppose the carrying surface of said carriage and having a radiation plane formed with a plurality of slots so as to radiate electromagnetic fields to the inside of said process container through the plurality of slots, wherein said slot antenna radiates the electromagnetic fields in a direction oblique to the normal direction of said radiation plane.

2. A plasma processing apparatus according to claim 1, wherein when the ratio $\epsilon_v/\epsilon_a$ between specific inductivity $\epsilon_v$ inside said slot antenna and specific inductivity $\epsilon_a$ outside said slot antenna is $\epsilon_r$, the wavelength of an electromagnetic field propagating in said slot antenna is $\lambda_g$, the pitch between adjacent slots in the propagation direction of the electromagnetic field inside said slot antenna is defined as $p=\alpha \cdot \lambda_g$, where $\alpha>0$ stands, and N is an integer not less than 0, the $\epsilon_r$, N and $\alpha$ are so set as to satisfy $$-1 \leq \epsilon_r^{1/2}(N/\alpha-1) \leq 1$$

N≠α a for N being not less than 1.

3. A plasma processing apparatus according to claim 2, wherein said pitch between adjacent slots changes in the propagation direction of the electromagnetic field inside said slot antenna.

4. A plasma processing apparatus according to claim 1 further comprising a dielectric member disposed to isolate said slot antenna from the carrying surface of said carriage and having a surface oblique to the radiation plane of said slot antenna.

5. A plasma processing apparatus according to claim 4, wherein said dielectric member takes the form of a dome.

6. A plasma processing apparatus according to claim 4, wherein said dielectric member isolates at least part of the inner surface of said process container from the carrying surface of said carriage.

7. A plasma processing apparatus according to claim 1 further comprising a first dielectric member disposed to isolate said slot antenna from the carrying surface of said carriage and having a surf ace oblique to the radiation plane of said slot antenna, a second dielectric member disposed, when referenced to said first dielectric member, on the side opposite to said carriage and being cooperative with said first dielectric member to form a hermetically closed space, and circulation means for circulating fluid through said hermetically closed space to adjust the temperature of said first dielectric member.

8. A plasma processing apparatus according to claim 1, wherein said slot antenna is a radial antenna including first and second conductive plates mutually spaced to oppose to each other and a ring member for shielding said first and second conductive plates at their outer peripheries, said first conductive plate being formed with said plurality of slots, and an inlet port for admitting the electromagnetic field to a space between said first and second conductive plates is formed in the center of said second conductive plate.

9. A plasma processing apparatus according to claim 2, wherein said slot antenna is a radial antenna including first and second conductive plates mutually spaced to oppose to each other and a ring member for shielding said first and second conductive plates at their outer peripheries, said first conductive plate being formed with said plurality of slots, and an inlet port for admitting the electromagnetic field to a space between said first and second conductive plates is formed in the center of said second conductive plate.

10. A plasma processing apparatus according to claim 4, wherein said slot antenna is a radial antenna including first and second conductive plates mutually spaced to oppose to each other and a ring member for shielding said first and second conductive plates at their outer peripheries, said first conductive plate being formed with said plurality of slots, and an inlet port for admitting the electromagnetic field to a space between said first and second conductive plates is formed in the center of said second conductive plate.

11. A plasma processing apparatus according to claim 5, wherein said slot antenna is a radial antenna including first and second conductive plates mutually spaced to oppose to each other and a ring member for shielding said first and second conductive plates at their outer peripheries, said first conductive plate being formed with said plurality of slots, and an inlet port for admitting the electromagnetic field to a space between said first and second conductive plates is formed in the center of said second conductive plate.

12. A plasma processing apparatus according to claim 6, wherein said slot antenna is a radial antenna including first and second conductive plates mutually spaced to oppose to each other and a ring member for shielding said first and second conductive plates at their outer peripheries, said first conductive plate being formed with said plurality of slots, and an inlet port for admitting the electromagnetic field to a space between said first and second conductive plates is formed in the center of said second conductive plate.

13. A plasma processing apparatus according to claim 7, wherein said slot antenna is a radial antenna including first and second conductive plates mutually spaced to oppose to each other and a ring member for shielding said first and second conductive plates at their outer peripheries, said first conductive plate being formed with said plurality of slots, and an inlet port for admitting the electromagnetic field to a space between said first and second conductive plates is formed in the center of said second conductive plate.

14. A plasma processing apparatus according to claim 1, wherein said slot antenna is a rectangular waveguide antenna including a rectangular waveguide having its one surface formed with said plurality of slots.

15. A plasma processing apparatus according to claim 2, wherein said slot antenna is a rectangular waveguide antenna including a rectangular waveguide having its one surface formed with said plurality of slots.

16. A plasma processing apparatus according to claim 4, wherein said slot antenna is a rectangular waveguide antenna including a rectangular waveguide having its one surface formed with said plurality of slots.

17. A plasma processing apparatus according to claim 5, wherein said slot antenna is a rectangular waveguide antenna including a rectangular waveguide having its one surface formed with said plurality of slots.

18. A plasma processing apparatus according to claim 6, wherein said slot antenna is a rectangular waveguide antenna including a rectangular waveguide having its one surface formed with said plurality of slots.

19. A plasma processing apparatus according to claim 7, wherein said slot antenna is a rectangular waveguide antenna including a rectangular waveguide having its one surface formed with said plurality of slots.

* * * * *

UNITED STATES PATENT AND TRADEMARK OFFICE
CERTIFICATE OF CORRECTION

PATENT NO.     : 6,713, 968 B2
DATED          : March 30, 2004
INVENTOR(S)    : Nobuo Ishii and Yasuyoshi Yasaka It is certified that error appears in the above-identified patent and that said Letters Patent is hereby corrected as shown below:

Column 18,
Line 34, "N≠$a$ a for" should read -- N≠$a$ for --.
Line 53, "surf ace" should read -- surface --.

Signed and Sealed this

Sixth Day of July, 2004

JON W. DUDAS
*Acting Director of the United States Patent and Trademark Office*